(12) United States Patent
Zhan et al.

(10) Patent No.: US 12,444,706 B2
(45) Date of Patent: Oct. 14, 2025

(54) PACKAGE BONDING STRUCTURES AND METHOD OF FORMATION

(71) Applicant: Taiwan Semiconductor Manufacturing Co., Ltd., Hsinchu (TW)

(72) Inventors: Kai Jun Zhan, Taoyuan (TW); Chin-Fu Kao, Taipei (TW); Kuang-Chun Lee, New Taipei (TW); Ming-Da Cheng, Taoyuan (TW); Chen-Shien Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/629,670

(22) Filed: Apr. 8, 2024

(65) Prior Publication Data

US 2024/0258266 A1    Aug. 1, 2024

Related U.S. Application Data

(62) Division of application No. 17/347,871, filed on Jun. 15, 2021, now Pat. No. 11,978,720.

(60) Provisional application No. 63/142,563, filed on Jan. 28, 2021.

(51) Int. Cl.
*H01L 23/00* (2006.01)

(52) U.S. Cl.
CPC .............. *H01L 24/81* (2013.01); *H01L 24/16* (2013.01); *H01L 2224/16058* (2013.01); *H01L 2224/16227* (2013.01); *H01L 2224/81024* (2013.01); *H01L 2224/81193* (2013.01); *H01L 2224/81203* (2013.01)

(58) Field of Classification Search
None
See application file for complete search history.

(56) References Cited

U.S. PATENT DOCUMENTS

| 6,890,795 B1 | 5/2005 | Wong et al. |
| 8,552,553 B2 | 10/2013 | Lo et al. |
| 9,559,071 B2 * | 1/2017 | Lu .......................... H01L 24/14 |
| 2003/0001286 A1 | 1/2003 | Kajiwara et al. |

(Continued)

FOREIGN PATENT DOCUMENTS

| CN | 103700633 B | * 10/2017 | ........... H01L 21/486 |
| TW | 201205697 A | 2/2012 | |

(Continued)

*Primary Examiner* — Hung K Vu
(74) *Attorney, Agent, or Firm* — Slater Matsil, LLP

(57) ABSTRACT

A method includes attaching a die to a thermal compression bonding (TCB) head through vacuum suction, wherein the die comprises a plurality of conductive pillars, attaching a first substrate to a chuck through vacuum suction, wherein the first substrate comprises a plurality of solder bumps, contacting a first conductive pillar of the plurality of conductive pillars to a first solder bump of the plurality of solder bumps, wherein contacting the first conductive pillar to the first solder bump results in a first height between a topmost surface of the first conductive pillar and a bottommost surface of the first solder bump, and adhering the first solder bump to the first conductive pillar to form a first joint, wherein adhering the first solder bump to the first conductive pillar comprises heating the TCB head.

20 Claims, 28 Drawing Sheets

(56) References Cited

U.S. PATENT DOCUMENTS

| | | |
|---|---|---|
| 2012/0111922 A1 | 5/2012 | Hwang et al. |
| 2013/0292455 A1 | 11/2013 | Brofman et al. |
| 2014/0264856 A1* | 9/2014 | Huang .............. H01L 23/49894 |
| | | 438/126 |
| 2015/0021760 A1* | 1/2015 | Lin ................... H01L 23/49811 |
| | | 257/737 |
| 2016/0336292 A1 | 11/2016 | Tian et al. |

FOREIGN PATENT DOCUMENTS

| | | |
|---|---|---|
| TW | 201826406 A | 7/2018 |
| TW | 201917806 A | 5/2019 |

* cited by examiner

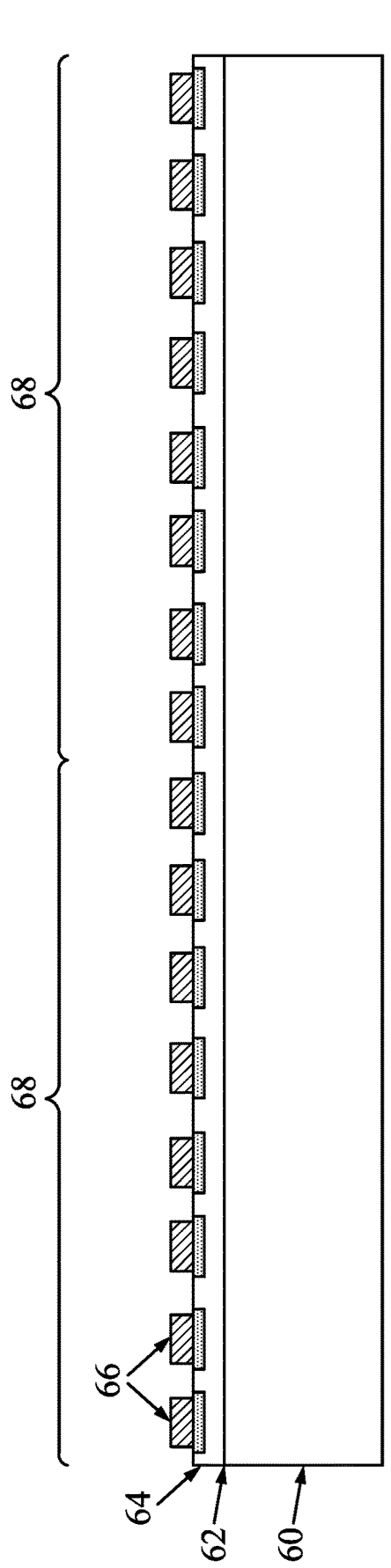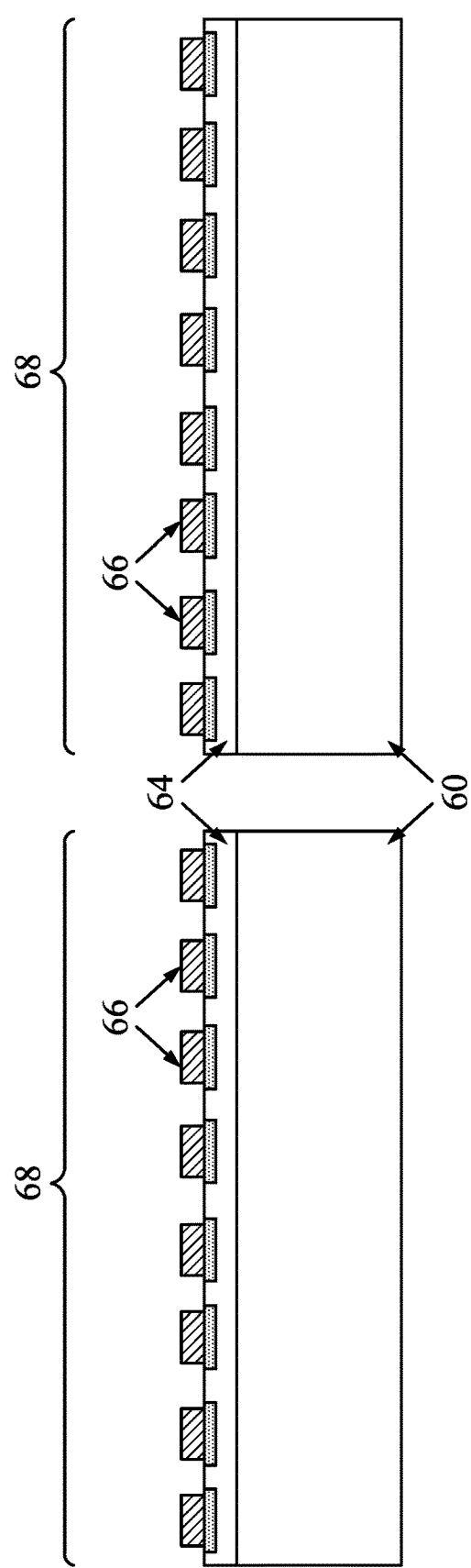

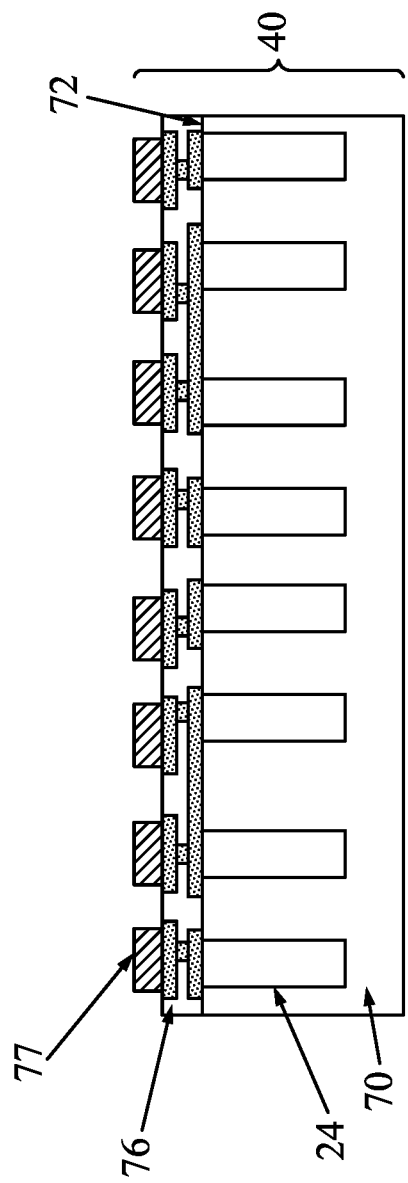
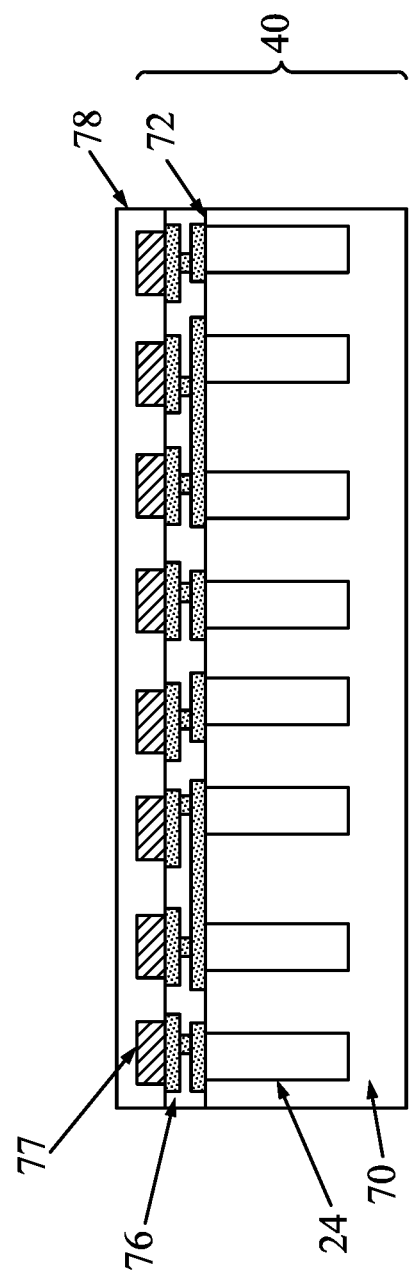

PACKAGE BONDING STRUCTURES AND METHOD OF FORMATION

PRIORITY CLAIM AND CROSS-REFERENCE

This patent application is a divisional of U.S. application Ser. No. 17/347,871 filed on Jun. 15, 2021, which claims priority to U.S. Provisional Application No. 63/142,563, filed on Jan. 28, 2021 and entitled "New Solder Bump Scheme for COP Improvement," which application is hereby incorporated by reference herein as if reproduced in its entirety.

BACKGROUND

Integrated circuits are formed on semiconductor wafers, which are then sawed into semiconductor chips. The semiconductor chips may be bonded onto package substrates. During the bonding process, the solder bumps between the semiconductor chips and the package substrates are reflowed. Conventional reflow methods include convection-type reflow or thermal compressive reflow. The convection-type reflow has relatively high throughput since multiple package substrates and the overlying dies may be bonded through the reflow at the same time. However, the convection-type reflow requires a long period of time to heat solder bumps. The resulting high thermal budget may cause significant warpage in the dies, and may possibly cause delamination between low-k dielectric layers in the dies.

The thermal compressive reflow requires a lower thermal budget than the convection-type reflow. In conventional thermal compressive bonding processes, a die is stacked on a package substrate, with the solder bumps on a surface of the die, being pressed against the solder bumps on the surface of the package substrate. After melting the solder bumps, solder bumps cool down to solidify.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3, 4, 5, 6A, 6B, 6C, 7, 8, 9, 10 and 11 illustrate cross-sectional views of intermediary stages of manufacturing a semiconductor device package 1000 in accordance with some embodiments.

DETAILED DESCRIPTION

Figure 5:
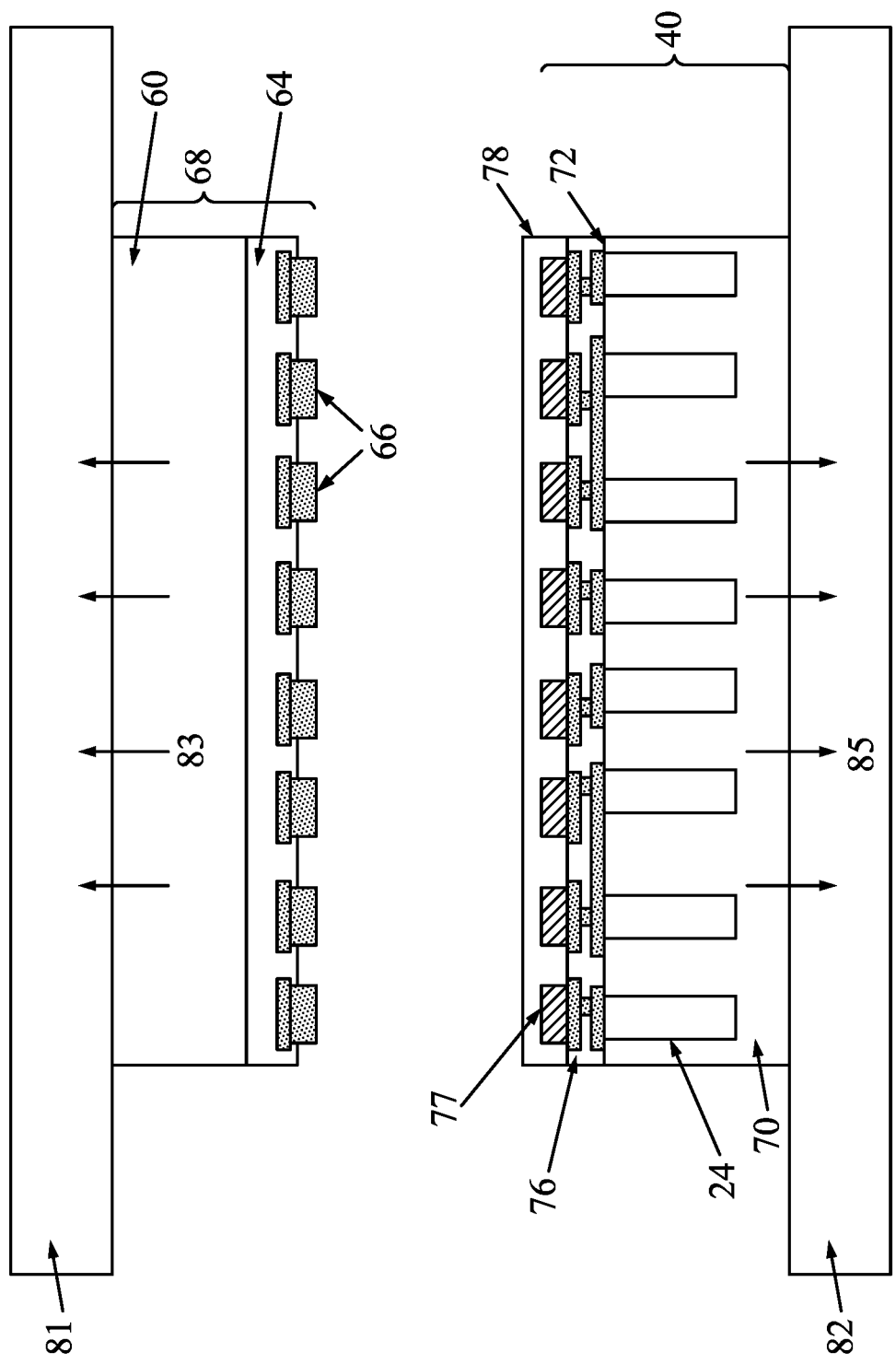

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of a device package comprising one or more semiconductor chips bonded to an interposer and a package substrate bonded to a side of the interposer opposing the one or more semiconductor chips. In some embodiments, the device package may be referred to a chip-on-wafer-on-substrate (CoWoS). The interposer may be bonded to the one or more semiconductor chips using solder bumps on the semiconductor chip(s) and/or the interposer that are reflowed using thermal compression bonding (TCB). The thermal compression bonding (TCB) apparatus comprises a TCB bonding head that provides a vacuum force to hold a first workpiece (e.g., a semiconductor chip) and a vacuum chuck table that provides a vacuum force to hold a second workpiece (e.g. a package substrate). During the bonding of the interposer to the semiconductor chip, a heating process is performed to reflow the solder bumps in which the TCB bonding head and the vacuum chuck table provide heat to reflow the solder bumps. During the heating process, the height of the solder bumps can be maintained to allow for the formation of solder bumps with a column shape, or the height of the solder bumps can be increased to allow for the formation of solder bumps with an hourglass shape. Advantageous features of one or more embodiments disclosed herein may include an improvement in the device package coplanarity (COP), and the prevention of deformation or warpage of the interposer and the package substrate due to the presence of the vacuum forces during the heating process. This improvement in coplanarity and reduced warpage allows for an improved connection between the package substrate (e.g., a printed circuit board) and the interposer when the package substrate and the interposer are bonded together.

Embodiments will be described with respect to a specific context, namely a Die-Interposer-Substrate stacked package using Chip-on-Wafer-on-Substrate (CoWoS) processing. However, other embodiments may also be applied to other packages. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIGS. 1, 2, 3, 4, 5, 6A, 6B, 6C, 7, 8, 9, 10 and 11 illustrate cross-sectional views of intermediary stages of manufacturing a semiconductor device package 1000 in accordance with some embodiments.

FIG. 1 illustrates one or more dies 68. In some embodiments, the one or more dies 68 may be initially formed as part of a wafer, which is subsequently singulated. In an embodiment, the substrate 60 may include a bulk semiconductor substrate, semiconductor-on-insulator (SOI) substrate, multi-layered semiconductor substrate, or the like. The semiconductor material of the substrate 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 60 may be doped or undoped. Devices, such as transistors, capacitors, resistors, diodes, and the like, may be formed in and/or on an active surface 62.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like.

More particularly, an inter-metallization dielectric (IMD) layer may be formed in the interconnect structure 64. The IMD layer may be formed, for example, of a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

Additionally, die connectors 66, such as conductive pillars, conductive bumps, or the like, are formed in and/or on the interconnect structure 64 to provide an external electrical connection to the circuitry and devices within the interconnect structure 64 and on the active surface 62. In the illustrated embodiment, the die connectors 66 are formed in openings of the dielectric layers of the interconnect structure 64. Each die connector 66 extends through an opening of a dielectric layer of the interconnect structure 64 to contact a conductive pad of the interconnect structure 64. A photoresist (not illustrated) may be formed by spin coating or the like and may be exposed to light for patterning. The patterning forms openings through the photoresist to expose the conductive pads of the interconnect structure 64. A conductive material is then formed in the openings of the photoresist and on the exposed portions of the conductive pads to form the die connectors 66. The die connectors 66 may comprise a metal such as copper, aluminum, gold, nickel, palladium, the like, or a combination thereof and may be formed by sputtering, printing, electro plating, electroless plating, CVD, or the like. The photoresist may be removed by an acceptable ashing or stripping process, such as using an oxygen plasma or the like. The die connectors 66 may be solder free and have substantially vertical sidewalls. In some embodiments, the die connectors 66 protrude from the interconnect structure 64 to form pillar structures to be utilized when bonding the dies 68 to other structures. One of ordinary skill in the art will appreciate that the above examples are provided for illustrative purposes. Other circuitry may be used as appropriate for a given application.

In FIG. 2, the substrate 60 including the interconnect structure 64 is singulated into individual dies 68. Typically, each of the dies 68 may contain the same circuitry, such as devices and metallization patterns, although the dies may have different circuitries in some embodiments. The singulation may include sawing, dicing, or the like.

The dies 68 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas). In an embodiment, each of the dies 68 may have a die area equal to or larger than 1200 mm$^2$. In an embodiment, each of the dies 68 may have a thickness that is equal to or larger than 400 μm.

FIG. 3 illustrates a package substrate 40, which may be initially formed as part of a wafer, for example. A substrate 70 of the package substrate 40 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Other substrates, such as multi-layered or gradient substrates, may also be used. The substrate 70 may be doped or undoped. Devices, such as transistors, capacitors, resistors, diodes, and the like, may be formed in and/or on a first surface 72, which may also be referred to as an active surface, of the substrate 70. In other embodiments, the package substrate 40 may be free of any active devices, and the package substrate 40 may be referred to as an interposer in such embodiments. In an embodiment, an area of a major surface of the package substrate 40 may be equal to or larger than 3600 mm$^2$.

Through-vias (sometimes referred to as Through-Substrate Vias (TSVs)) 24 may be formed to extend from the first surface 72 into the substrate 70. TVs 24 are also sometimes referred as through-silicon vias when formed in a silicon substrate. Although not shown in FIG. 3, each of TVs 24 may be encircled by an isolation liner, which is formed of a dielectric material such as silicon oxide, silicon nitride, or the like. The isolation liner isolates the respective TVs 24 from substrate 70.

Redistribution structure 76 is formed over the first surface 72 of the substrate 70, and is used to electrically connect to TVs 24. Redistribution structure 76 is also used to electrically connect the integrated circuit devices (if any) to external devices. The redistribution structure 76 may include one or more dielectric layer(s) and respective metallization pattern(s) in the dielectric layer(s). The metallization patterns may comprise vias and/or traces to interconnect any devices and/or to an external device. The metallization patterns are sometimes referred to as redistribution lines (RDL). The dielectric layers may comprise silicon oxide, silicon nitride, silicon carbide, silicon oxynitride, low-K dielectric material, such as PSG, BPSG, FSG, $SiO_x C_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, a plating process, or the like. Any excessive diffusion barrier layer and/or conductive material on the dielectric layer may be removed, such as by using a CMP.

Electrical connectors 77 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the conductive pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the pads. In the embodiment, where the pads are formed differently, more photoresist and patterning steps may be utilized.

In an embodiment, the electrical connectors 77 are then formed on the conductive pads and may comprise solder balls and/or bumps, such as micro-bumps, controlled collapse chip connection (C4), electroless nickel immersion Gold (ENIG), electroless nickel electroless palladium immersion gold technique (ENEPIG) formed bumps, or the like. In an embodiment, the electrical connectors 77 are formed by initially forming a patterned layer of solder through suitable methods such as evaporation, electroplating, printing, solder transfer, ball placement, or the like. Once a patterned layer of solder has been formed on the structure, a reflow may be performed in order to shape the material into the desired bump shapes. In an embodiment, the bump electrical connectors 77 may include a conductive material such as solder, copper, aluminum, gold, nickel, silver, palladium, tin, the like, or a combination thereof.

In FIG. 4, the electrical connectors 77 of the package substrate 40 are coated with a flux 78, such as a no-clean flux. The electrical connectors 77 may be dipped in the flux 78 or the flux 78 may be jetted onto the electrical connectors 77 in some embodiments.

FIG. 5 illustrates a thermal compression bonding (TCB) bonding head 81 and vacuum chuck table 82 of a thermal compression bonding (TCB) apparatus. The TCB bonding head 81 may comprise one or more vacuum channels used to create a first vacuum force 83, so that TCB bonding head 81 may be used to pick and hold a first workpiece (e.g., the die 68) as shown in FIG. 5. The function, position and vacuum force 83 of the TCB bonding head 81 may be adjustable which allows for vertical movement of the TCB bonding head 81. Likewise, the vacuum chuck table 82 may comprise one or more vacuum channels used to create a second vacuum force 85, so that vacuum chuck table 82 may be used to hold a second workpiece (e.g., the package substrate 40) as shown in FIG. 5.

Figure 6A:
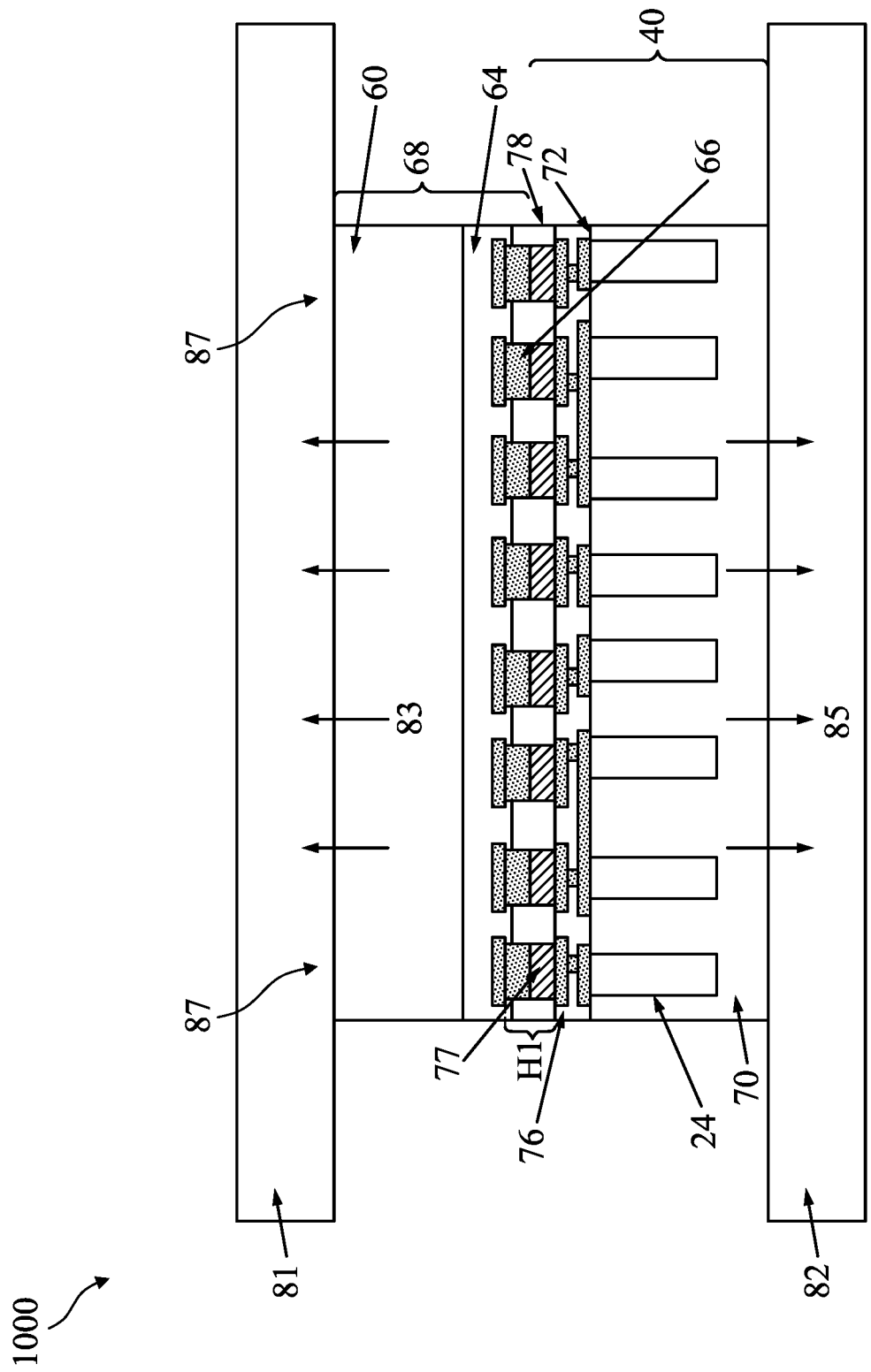

In FIG. 6A, TCB bonding head 81 may be used to pick up the die 68, and to place the die 68 on the package substrate 40, such that the electrical connectors 77 and the die connectors 66 are in contact. After the placement of the die 68 on the package substrate 40, TCB bonding head 81 remains contacting the die 68, and may apply an upward force on the die 68 due to the vacuum force 83. A position of the TCB bonding head 81 relative to the vacuum chuck table 82 may be maintained such that a height between a topmost surface of each die connector 66 and a bottommost surface of a corresponding electrical connector 77 that it is in contact with is equal to a first height H1. The TCB bonding head 81 is then heated and may provide heat to the die 68 in a heating process 87, which by thermal conduction causes the reflow of the electrical connectors 77 and the bonding of the electrical connectors 77 to the die connectors 66. In an embodiment, the TCB bonding head 81 includes coils (not shown) that heats up when an electrical current(s) flows through. In an embodiment, the heating process 87 may heat up the TCB bonding head 81 and the die 68 to a temperature in a range from 25° C. to 400° C. In an embodiment, the heating process 87 may be performed for a duration that is in a range from 0.1 s to 300 s. During the heating process 87, and during the melting of the electrical connectors 77, the height between the topmost surface of each die connector 66 and the bottommost surface of the corresponding electrical connector 66 is maintained at the first height H1 by holding the TCB bonding head 81 at a fixed vertical position relative to the vacuum chuck table 82. In an embodiment, the first height H1 may be in a range from 5 μm to 60 μm. In an embodiment, the first height H1 may be up to 100 μm.

Figure 6B:
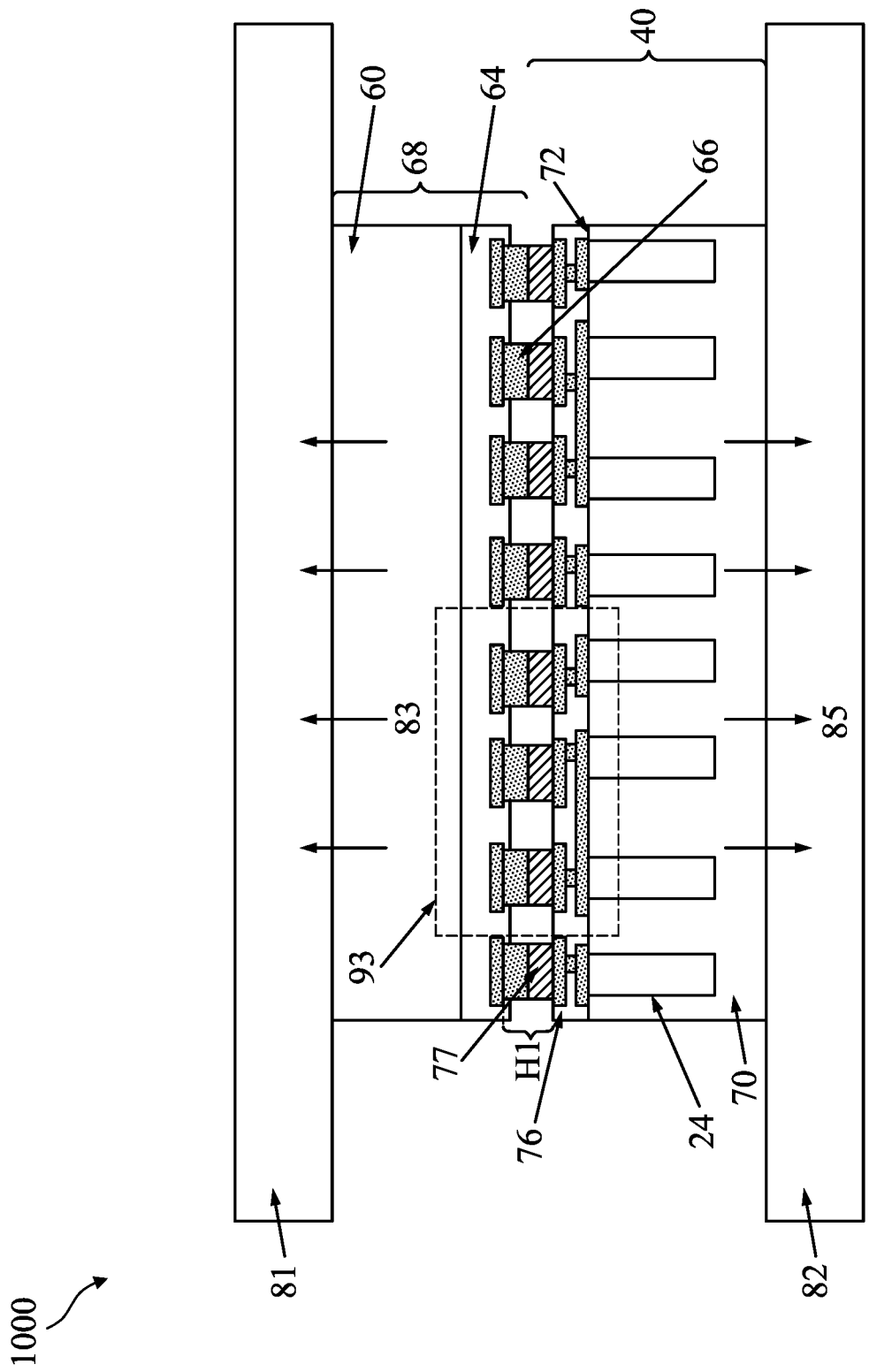
Figure 6C:
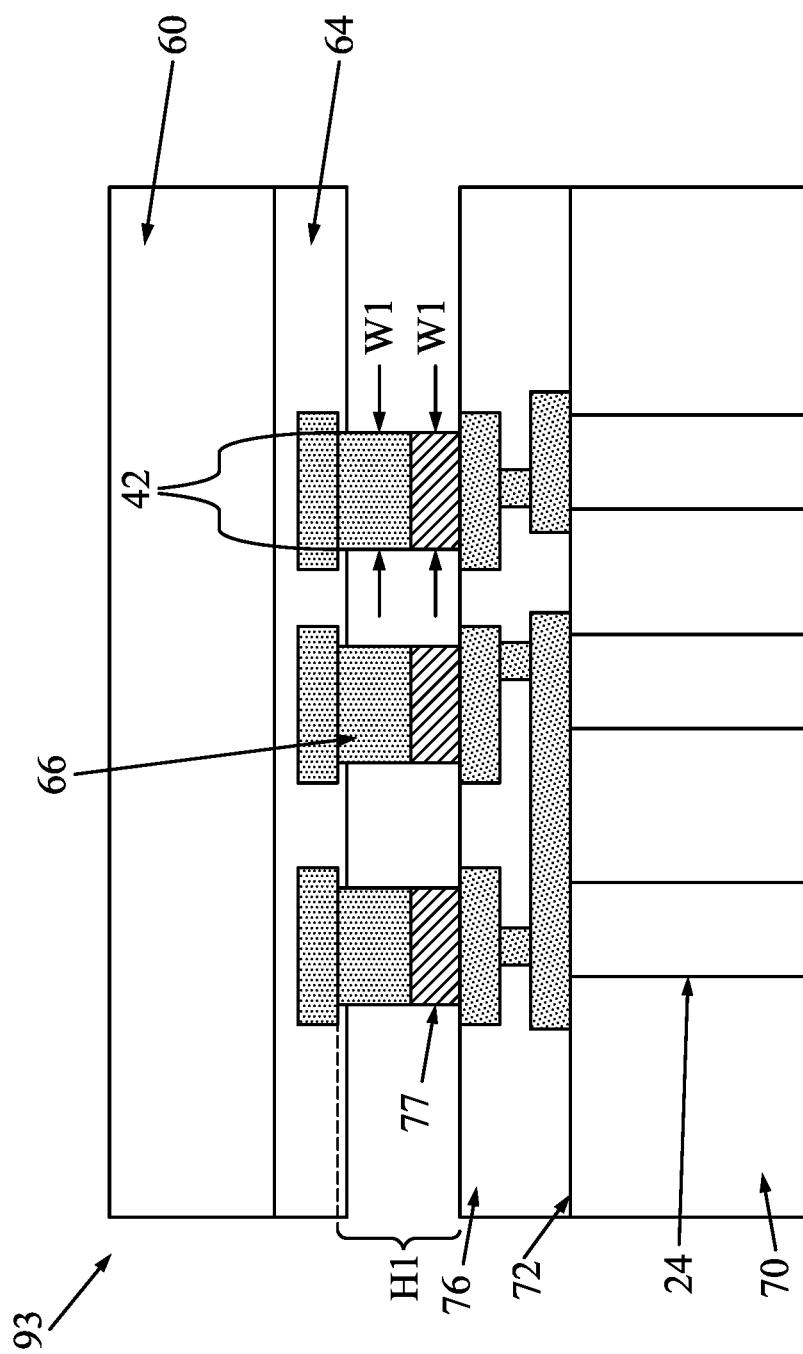

FIG. 6B illustrates a cross-sectional view of the device package 1000 after performing the reflow process and heating process 87 described above in FIG. 6A. FIG. 6C shows an enlarged view of the region 93 shown in FIG. 6B. The height between the topmost surface of each die connector 66 and the bottommost surface of a corresponding electrical connector 77 that it is in contact with is equal to the first height H1. Because the first height H1 is maintained during the heating process 87 shown in FIG. 6A, a column joint 42 is formed that has a uniform first width W1 throughout the an entirety of the first height H1 of the column joint 42. For example, the die connector 66 may have a cylindrical shape that has a uniform width equal to the first width W1, and the reflowed electrical connector 77 may likewise have a cylindrical shape that has uniform width equal to the first width W1. Flux 78 is then removed (or cleaned) using a method that may comprise spraying solvent, applying de-ionized (DI) water, heating, and drying the device package 1000, in accordance with some embodiments.

The electrical connectors 77 melt in the conventional reflow process without controlling the space between die and substrate, and are solidified thereafter. The space between die and substrate or space between two substrates in package(s) may change due to gravity and thermal expansion coefficient. The convectional reflow may cause deformation or warpage.

Advantages can be achieved as a result of the formation of the device package 1000 in which the package substrate 40 are bonded to the die 68 using the electrical connectors 77 on the package substrate 40 that are reflowed using thermal compression bonding (TCB). The thermal compression bonding (TCB) apparatus includes the TCB bonding head 81 that provides the vacuum force 83 to hold the die 68 and the vacuum chuck table 82 that provides the vacuum force 85 to hold the package substrate 40. During the bonding of the package substrate 40 to the die 68, the heating process 87 is performed to reflow the electrical connectors 77 in which the TCB bonding head 81 provides heat to reflow the electrical connectors 77. During the heating process 87, the first height H1 between the topmost surfaces of the die connectors 66 and the bottommost surfaces of the electrical connectors 77 are maintained at a constant in order to allow for the formation of the column joint 42. The advantages may include an improvement in the coplanarity (COP) of the device package 1000 and the prevention of deformation or warpage of the die 68 and the package substrate 40 due to the presence of the vacuum forces 83 and 85 during the heating process 87. This improvement in coplanarity and reduced warpage further allows for an improved connection between the package substrate 40 and another component package 44 (e.g., a printed circuit board described below in FIG. 8) when the package substrate 40 and the component package 44 are bonded together.

Figure 7:
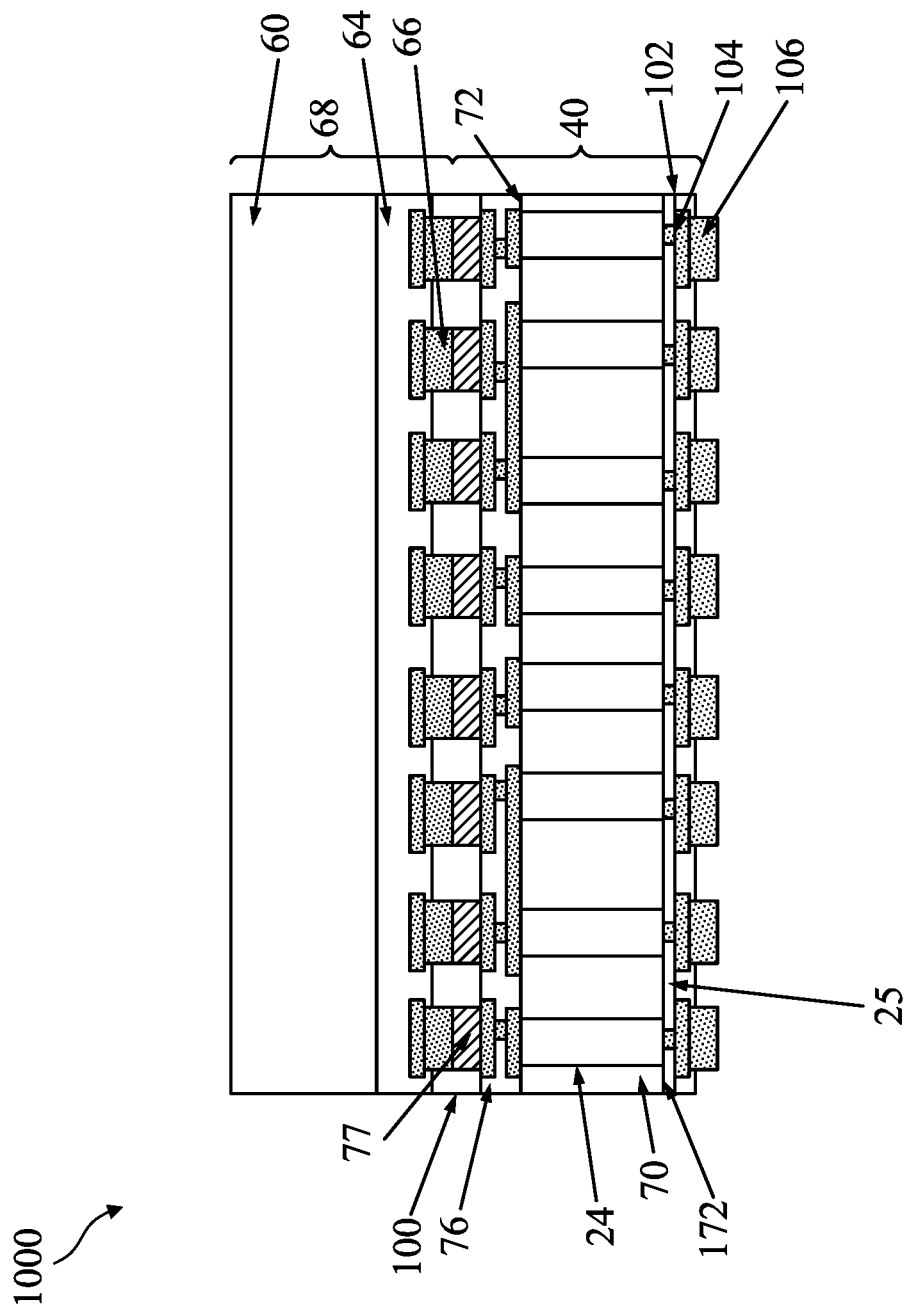

In FIG. 7, an underfill material 100 is dispensed into the gap between the die 68 and the redistribution structure 76. In some embodiments, the underfill material 100 may extend up along sidewall of the die 68. The underfill material 100 may be any acceptable material, such as a polymer, epoxy, molding underfill, or the like. The underfill material 100 may be formed by a capillary flow process after the die 68 is attached, or may be formed by a suitable deposition method before the die 68 is attached.

In a subsequent step, a planarization step such as a CMP step or a mechanical grinding step is performed to thin the substrate 70 of the package substrate 40. In accordance with some embodiments of the present disclosure, the planarization process is performed until the through-vias 24 are exposed through a second surface 172 of the substrate 70.

Redistribution structure 102 may then be formed over the second surface 172 of the substrate 70, and is used to electrically connect through-vias 24 to a subsequently bonded component package 44 (described in FIG. 8). The redistribution structure 102 may include one or more dielectric layer(s) and respective metallization pattern(s) in the dielectric layer(s). The metallization patterns may comprise vias and/or traces to interconnect the through-vias 24 to an external device. The metallization patterns are sometimes referred to as redistribution lines (RDL).

In accordance with some embodiments of the present disclosure, a dielectric layer 25 may be formed over the second surface 172 and may comprise a polymer such as PBO, polyimide, or the like. The formation method may include coating the dielectric layer 25 in a flowable form, and then curing the dielectric layer 25. In accordance with some embodiments of the present disclosure, the dielectric layer 25 may be formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings are then formed in the dielectric layer 25, for example, through a photo lithography process that exposes the through-vias 24 through the openings.

Next, RDL 104 is formed, that may include vias formed in the openings of the dielectric layer 25 to contact through-vias 24, and metal traces (metal lines) over the dielectric layer 25. In accordance with some embodiments of the present disclosure, RDL 104 is formed in a plating process, which includes depositing a metal seed layer (not shown), forming and patterning a photo resist (not shown) over the metal seed layer, and plating a metallic material such as copper and/or aluminum over the metal seed layer. The metal seed layer and the plated metallic material may be formed of the same material or different materials. The patterned photo resist is then removed, followed by etching the portions of the metal seed layer previously covered by the patterned photo resist.

In an embodiment, one or more dielectric layers may be formed over the dielectric layer 25. In an embodiment, one or more RDLs may be formed over and connecting to RDL 104. The one or more dielectric layers may be formed using a material selected from the same or different group of candidate materials for forming the dielectric layer 25, which may include PBO, polyimide, BCB, or other organic or inorganic materials. The material and the formation process of the one or more RDLs may be the same as the formation of RDL 104, which includes forming a seed layer, forming a patterned mask, plating each of the one or more RDLs and then removing the patterned mask and undesirable portions of the seed layer.

FIG. 7 further illustrates the formation of electrical connectors 106, such as conductive pillars, conductive bumps, or the like, that are formed in and/or on the redistribution structure 102 to provide an external electrical connection to the circuitry and devices within the redistribution structure 76 and on the first surface 72 through the TVs 24. In an embodiment, the electrical connectors 106 are formed in openings of the dielectric layers of the redistribution structure 102. Each electrical connector 106 extends through an opening of a topmost dielectric layer of the redistribution structure 102 to contact a conductive pad (e.g., RDL 104 of the redistribution structure 102). The material and the formation process of the electrical connectors 106 may be the same as the formation of the die connectors 66 described previously in FIG. 1. Accordingly, the process steps and applicable materials may not be repeated herein.

Figure 8:
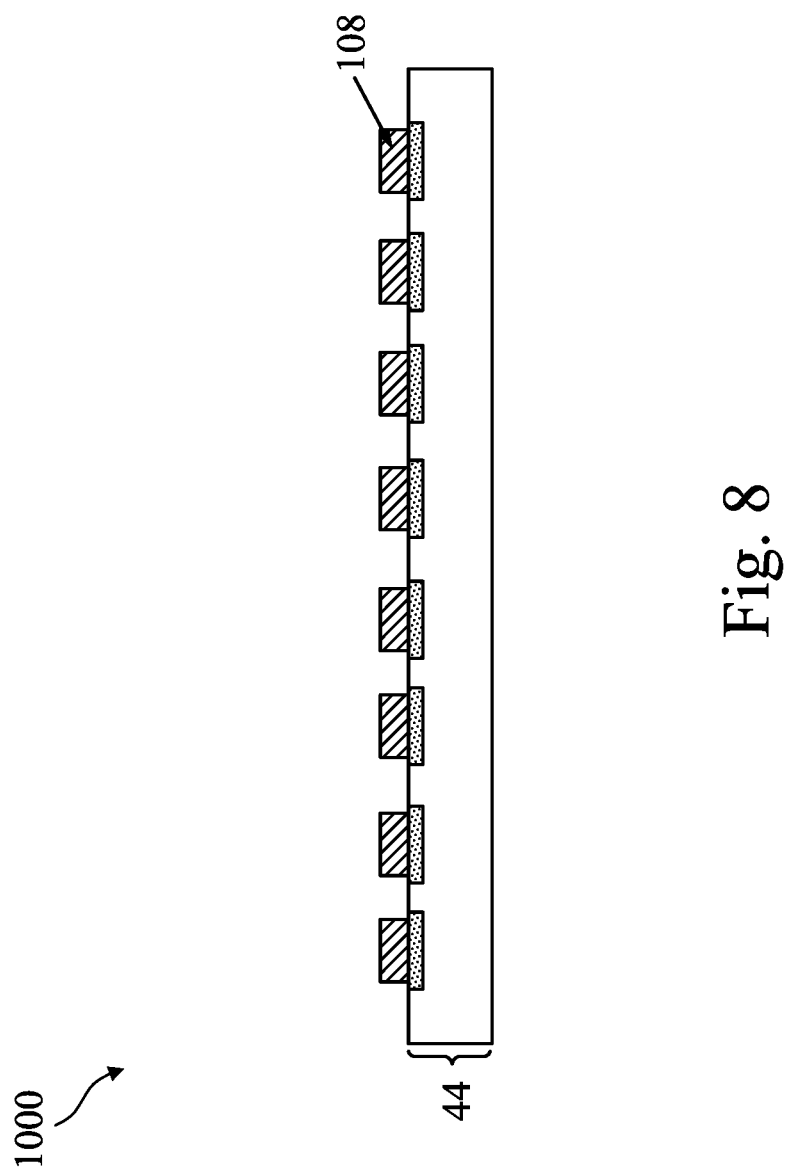

In FIGS. 8 through 11, a component package 44 is attached to the package substrate 40. The component package 44 may comprise a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized. As illustrated in FIG. 8, the component package 44 may comprise electrical connectors 108 that may include solder balls and/or bumps, such as controlled collapse chip connection (C4), electroless nickel immersion Gold (ENIG), electroless nickel electroless palladium immersion gold technique (ENEPIG) formed bumps, or the like. In an embodiment, the electrical connectors 108 are formed by initially forming a layer of solder through suitable methods such as evaporation, electroplating, printing, solder transfer, ball placement, or the like. Once a layer of solder has been formed on the structure, a reflow may be performed in order to shape the material into the desired bump shapes. In an embodiment, the bump electrical connectors 108 may include a conductive material such as solder, copper, aluminum, gold, nickel, silver, palladium, tin, the like, or a combination thereof.

Figure 9:
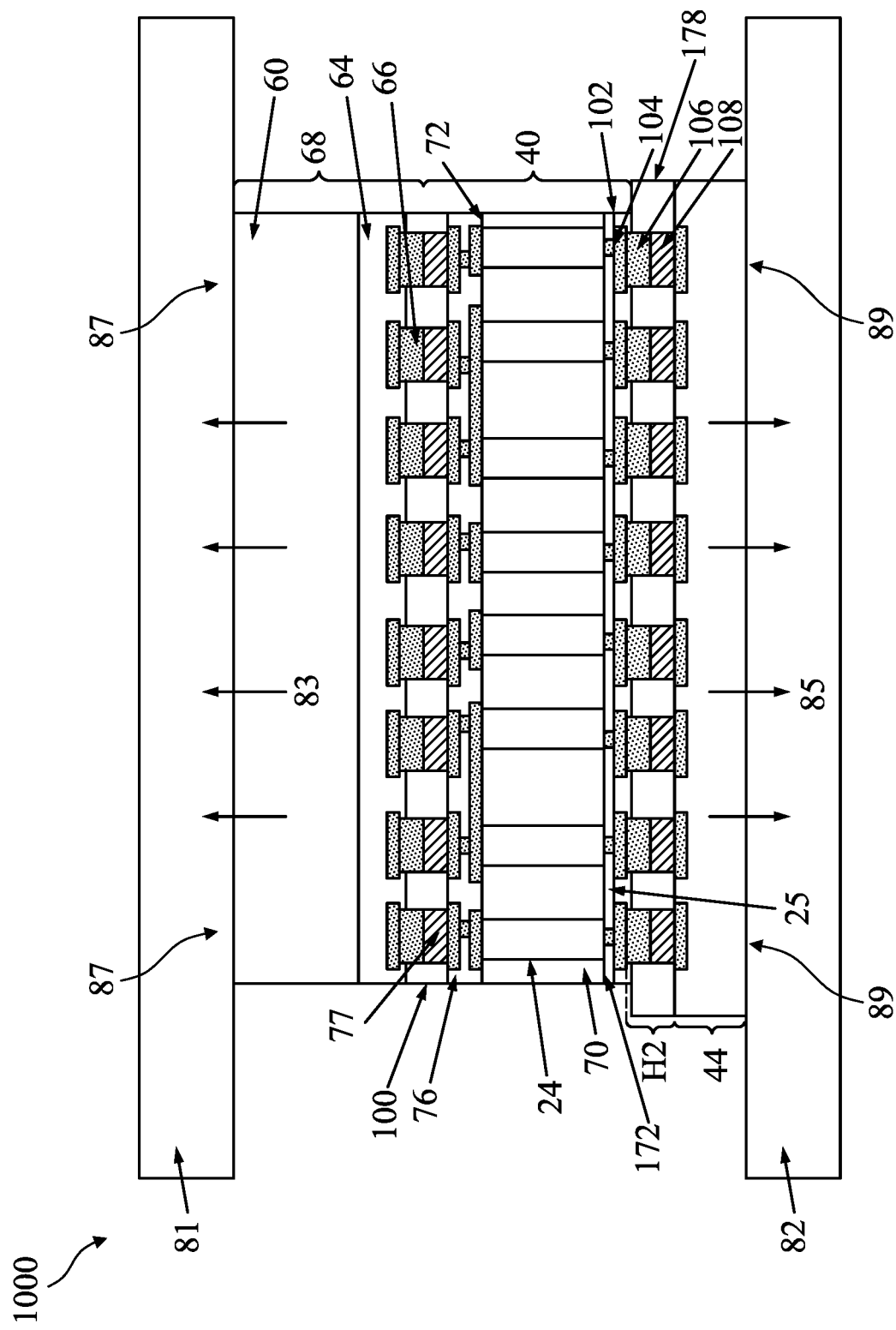

In FIG. 9, the electrical connectors 108 of the component package 44 are coated with a flux 178, such as a no-clean flux. The electrical connectors 108 may be dipped in the flux 178 or the flux 178 may be jetted onto the electrical connectors 108. In another embodiment, the flux 178 may also be applied to the electrical connectors 108. TCB bonding head 81 may then be used to pick up the device package 1000 shown in FIG. 7, and to place the device package 1000 on the component package 44, such that the electrical connectors 108 and the electrical connectors 106 are in contact. The vacuum chuck table 82 may be used to hold the component package 44. After the placement of the device package 1000 on the component package 44, TCB bonding head 81 remains contacting the device package 1000, and may apply an upward force on the device package 1000 due to the vacuum force 83 A position of the TCB bonding head 81 relative to the vacuum chuck table 82 may be maintained such that a height between a topmost surface of each electrical connector 106 and a bottommost surface of a corresponding electrical connector 108 that it is in contact with is equal to a second height H2. The TCB bonding head 81 is then heated and may provide heat to the device package 1000 in the heating process 87, which by thermal conduction causes the reflow of the electrical connectors 108 and the bonding of the electrical connectors 108 to the electrical connectors 106. In an embodiment, the vacuum chuck table 82 may also be heated and may provide heat to the component package 44 in a heating process 89. In an embodiment, the vacuum chuck table 82 includes coils (not shown) that heats up when an electrical current(s) flows through. In an embodiment, the heating process 89 may heat up the vacuum chuck table 82 to a temperature in a range from 25° C. to 400° C. In an embodiment, the heating process 89 may be performed for a duration that is in a range from 0.1 s to 300 s. During the heating processes 87 and 89 and during the melting of the electrical connectors 108, the height between the topmost surface of each electrical connector 106 and the bottommost surface of the corresponding electrical connector 108 is maintained at the second height H2 by holding the TCB bonding head 81 at a fixed vertical position. In an embodiment, the second height H2 may be in a range from 40 μm to 130 μm. In an embodiment, the second height H2 is at least 10 μm.

Figure 10:
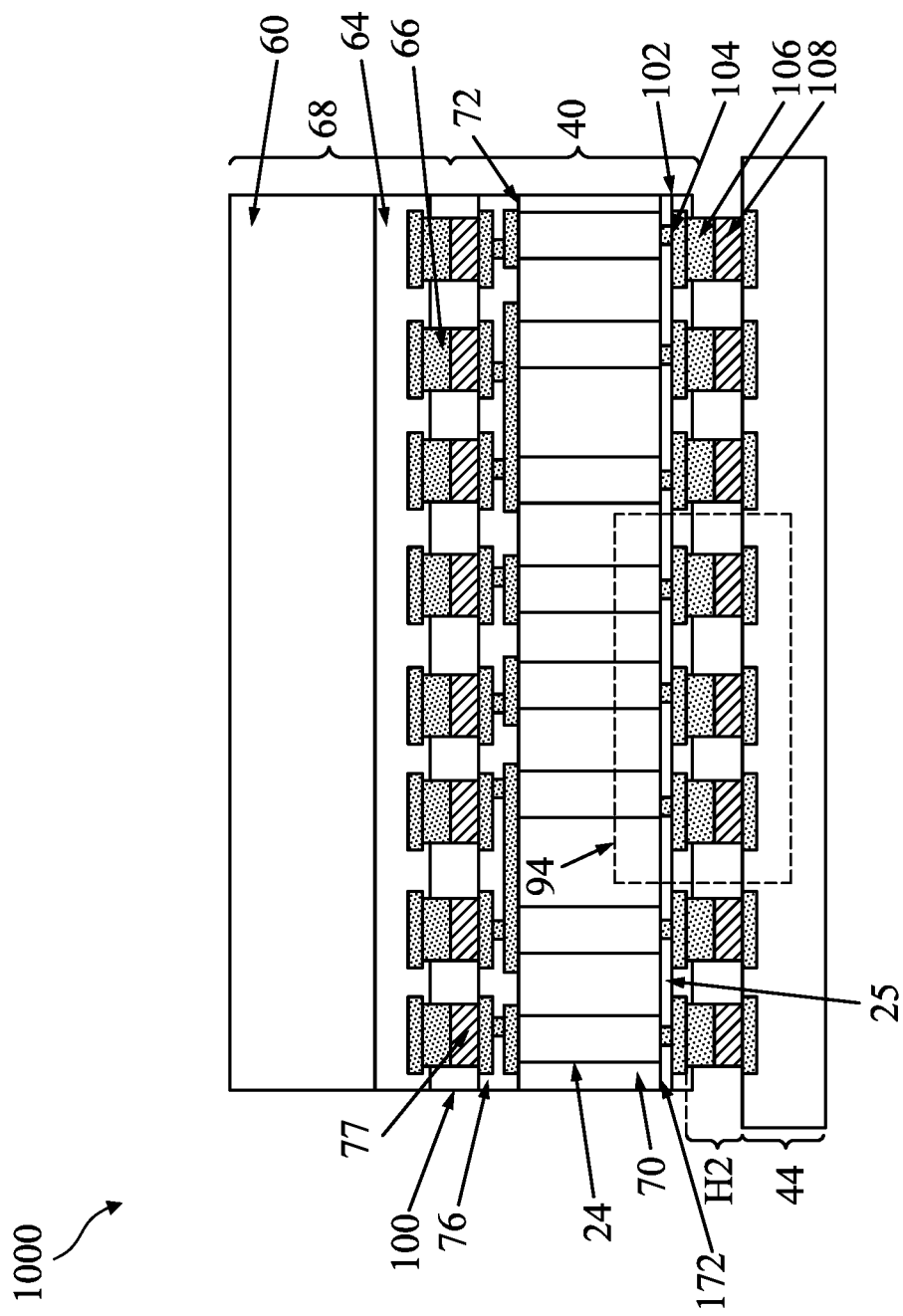
Figure 11:
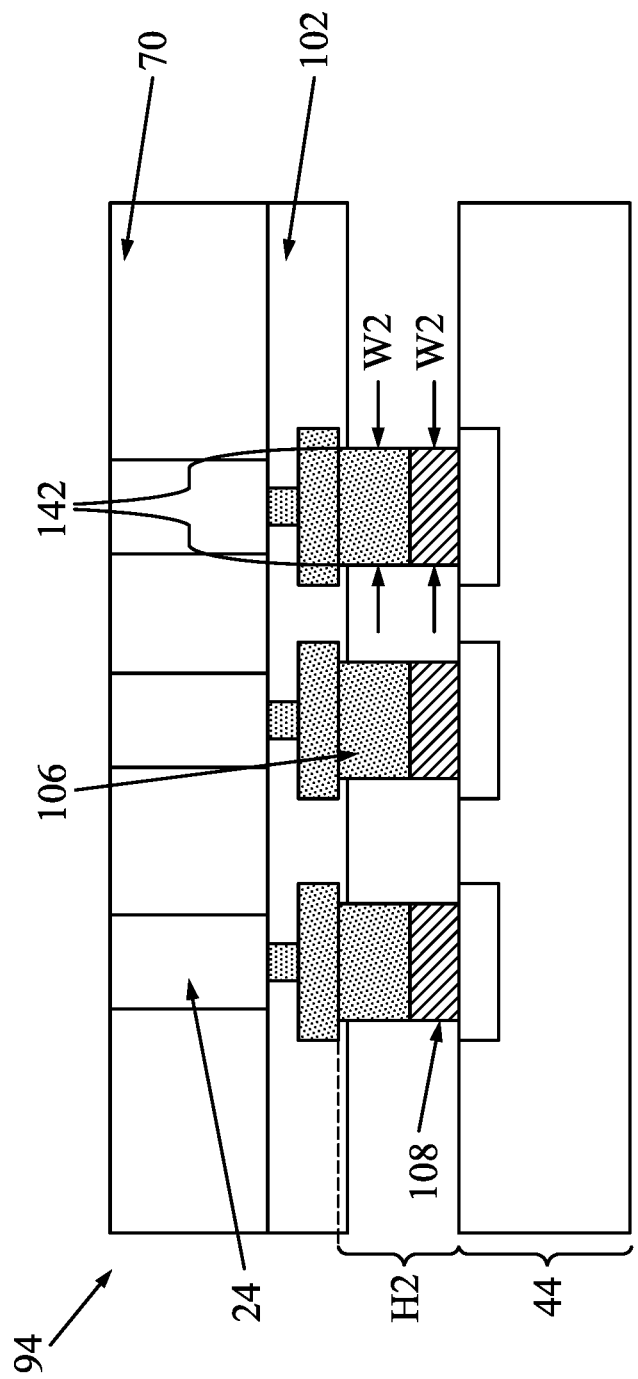

FIG. 10 illustrates a cross-sectional view of the device package 1000 after performing the reflow process and heating process 87 and 89 described above in FIG. 9. FIG. 11 shows an enlarged view of the region 94 shown in FIG. 10. The height between the topmost surface of each electrical connector 106 and the bottommost surface of a corresponding electrical connector 108 that it is in contact with is equal to the second height H2. Because the second height H2 is maintained during the heating process 87 and 89 shown in FIG. 9, a column joint 142 is formed that has a uniform second width W2 throughout the an entirety of the second height H2 of the column joint 142. For example, the electrical connector 106 may have a cylindrical shape that has a uniform width equal to the second width W2, and the reflowed electrical connector 108 may likewise have a cylindrical shape that has uniform width equal to second width W2. Flux 178 is then removed (or cleaned) using a method that may comprise spraying solvent, applying deionized (DI) water, heating, and drying the device package 1000, in accordance with some embodiments.

An underfill material (not shown) can be dispensed between the component package 44 and the package substrate 40. The underfill material may be any acceptable material, such as a polymer, epoxy, molding underfill, or the like. In an alternate embodiment, the component package 44 is attached to the package substrate 40 in the manner described subsequently in FIGS. 12E through 12H. Accordingly, the process steps and applicable materials may not be repeated herein.

FIGS. 12A, 12B, 12C and 12D illustrate cross-sectional views of intermediary stages of manufacturing a semiconductor device package 2000, in accordance with some embodiments. The device package 2000 is another embodiment in which like reference numerals represent like components in the embodiment shown in FIGS. 1 through 11, unless specified otherwise. Accordingly, the process steps and applicable materials may not be repeated herein. The initial steps of this embodiment are essentially the same as shown in FIGS. 1 through 5.

Figure 12A:
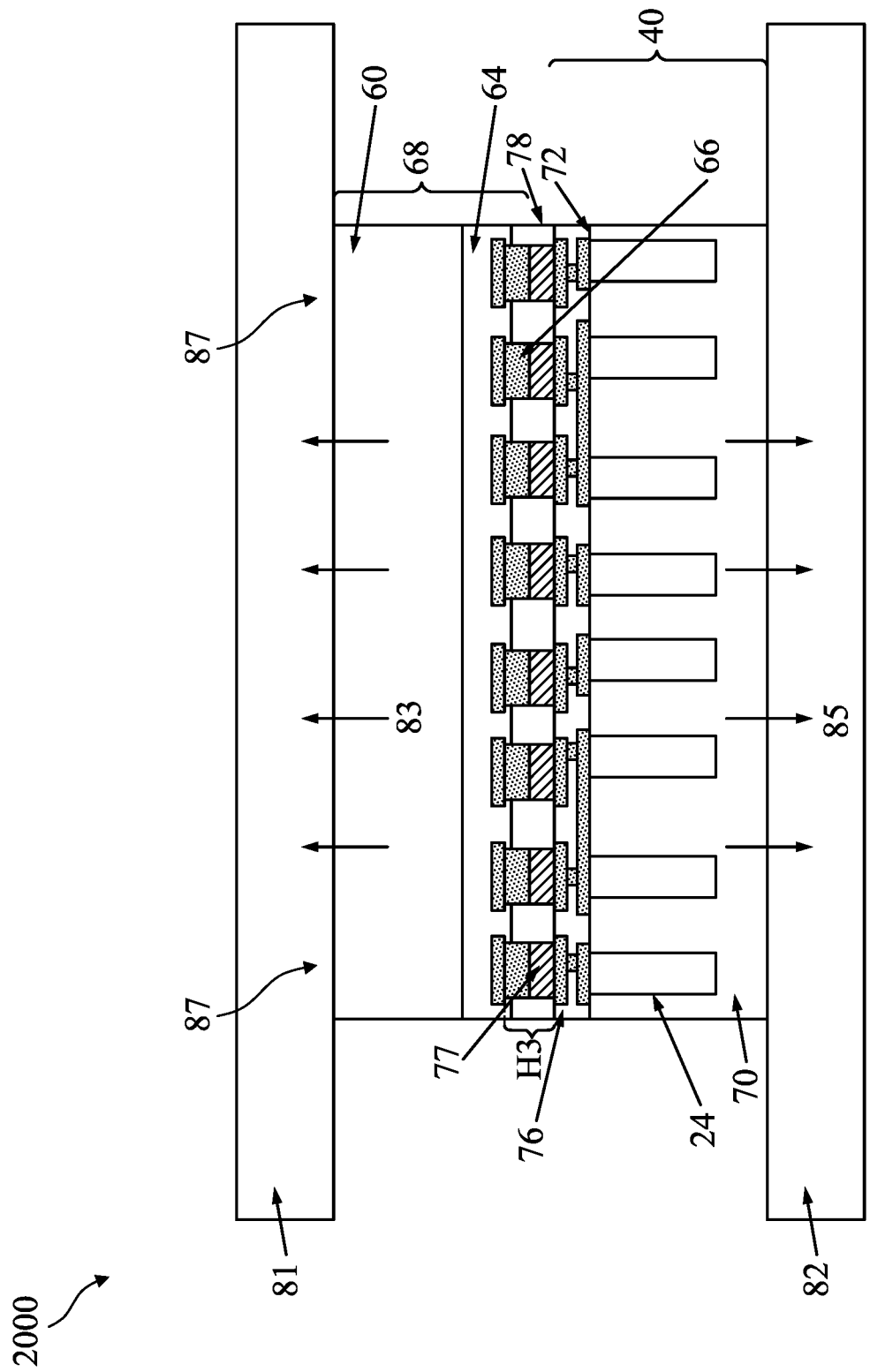
FIGS. 12A, 12B, 12C, 12D, 12E, 12F, 12G, and 12H illustrate cross-sectional views of intermediary stages of manufacturing a semiconductor device package 2000 in accordance with alternate embodiments.
Figure 12B:
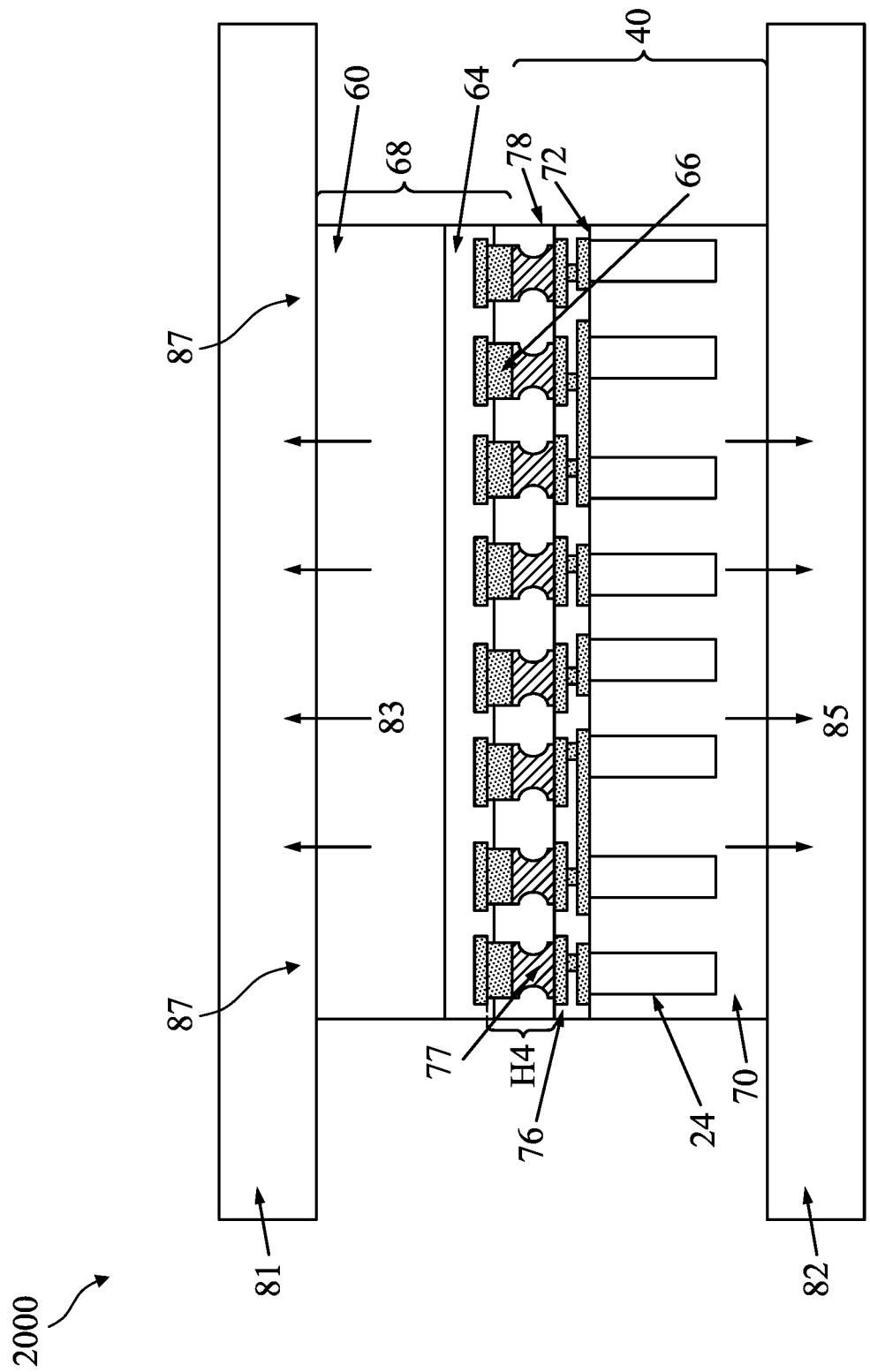

In FIG. 12A, TCB bonding head 81 may be used to pick up the die 68, and to place the die 68 on the package substrate 40, such that the electrical connectors 77 and the die connectors 66 are in contact. After the placement of the die 68 on the package substrate 40, TCB bonding head 81 remains contacting the die 68, and may apply an upward force on the die 68 due to the vacuum force 83 After the electrical connectors 77 and the die connectors 66 are brought into contact, a position of the TCB bonding head 81 relative to the vacuum chuck table 82 may be such that a height between a topmost surface of each die connector 66 and a bottommost surface of a corresponding electrical connector 77 that it is in contact with is equal to a third height H3. The TCB bonding head 81 is then heated and may provide heat to the die 68 in a heating process 87, which by thermal conduction causes the reflow of the electrical connectors 77 and the bonding of the electrical connectors 77 to the die connectors 66. In an embodiment, the TCB bonding head 81 includes coils (not shown) that heats up when an electrical current(s) flows through. In an embodiment, the heating process 87 may heat up the TCB bonding head 81 and the die 68 to a temperature in a range from 25° C. to 400° C. In an embodiment, the heating process 87 may be performed for a duration that is in a range from 0.1 s to 300 s. During the heating process 87 and during the melting of the electrical connectors 77, the height between the topmost surface of each die connector 66 and the bottommost surface of the corresponding electrical connector 66 that it is in contact with is adjusted to be at a fourth height H4, as shown in FIG. 12B. This may be performed by vertically adjusting the height of the TCB bonding head 81 relative to the vacuum chuck table 82. In some embodiments, the fourth height H4 may be larger than the third height H3. For example, a distance between the topmost surfaces of the die connectors 66 and the bottommost surfaces of the electrical connectors 77 may be increased. In an embodiment, the third height H3 may be in a range from 5 µm to 60 µm and the fourth height H4 may be in a range from 7 µm to 70 µm. In an embodiment, the third height H3 may be up to 100 µm. In an embodiment, the fourth height H4 may be up to 100 µm.

Figure 12C:
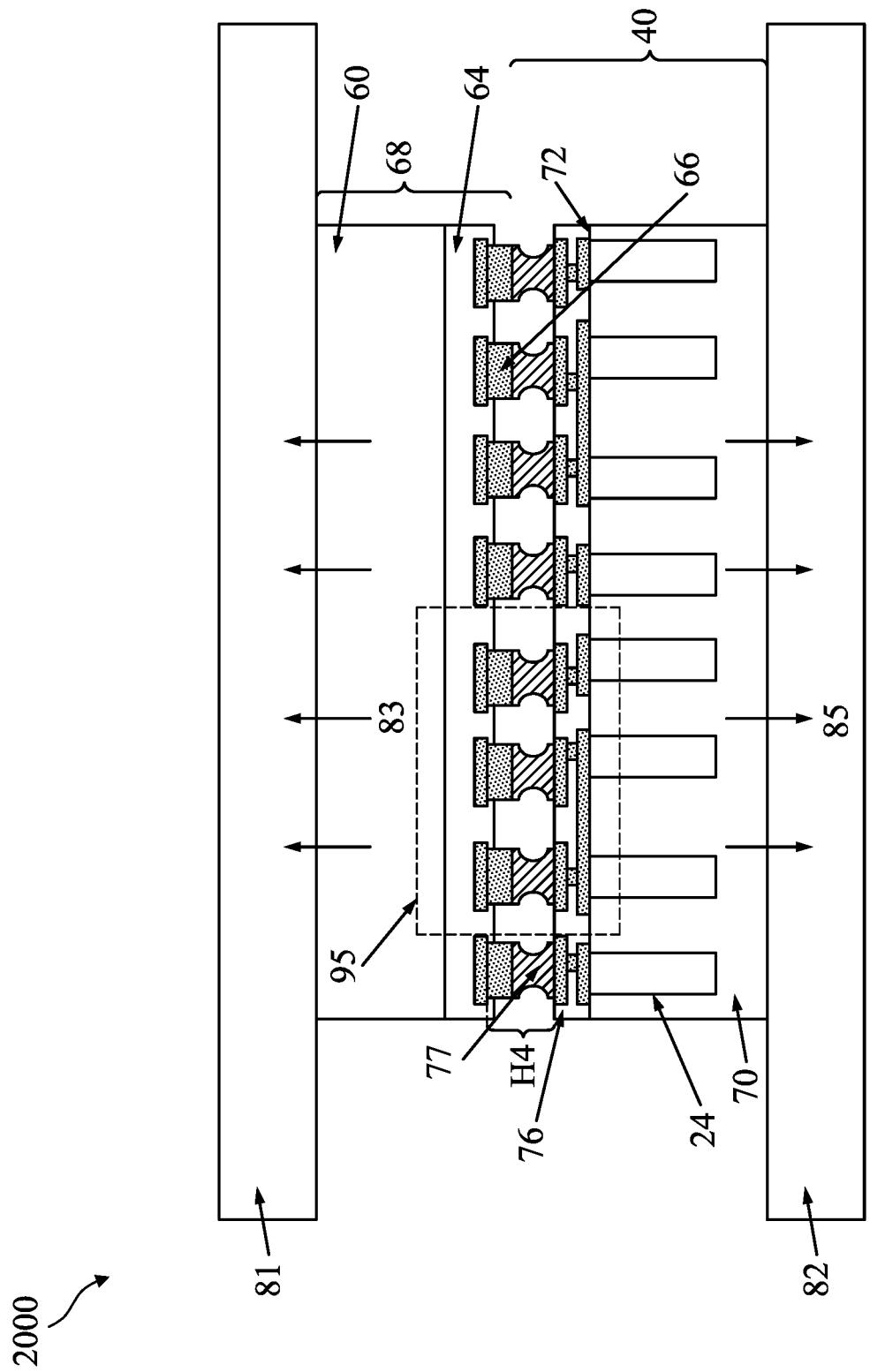
Figure 12D:
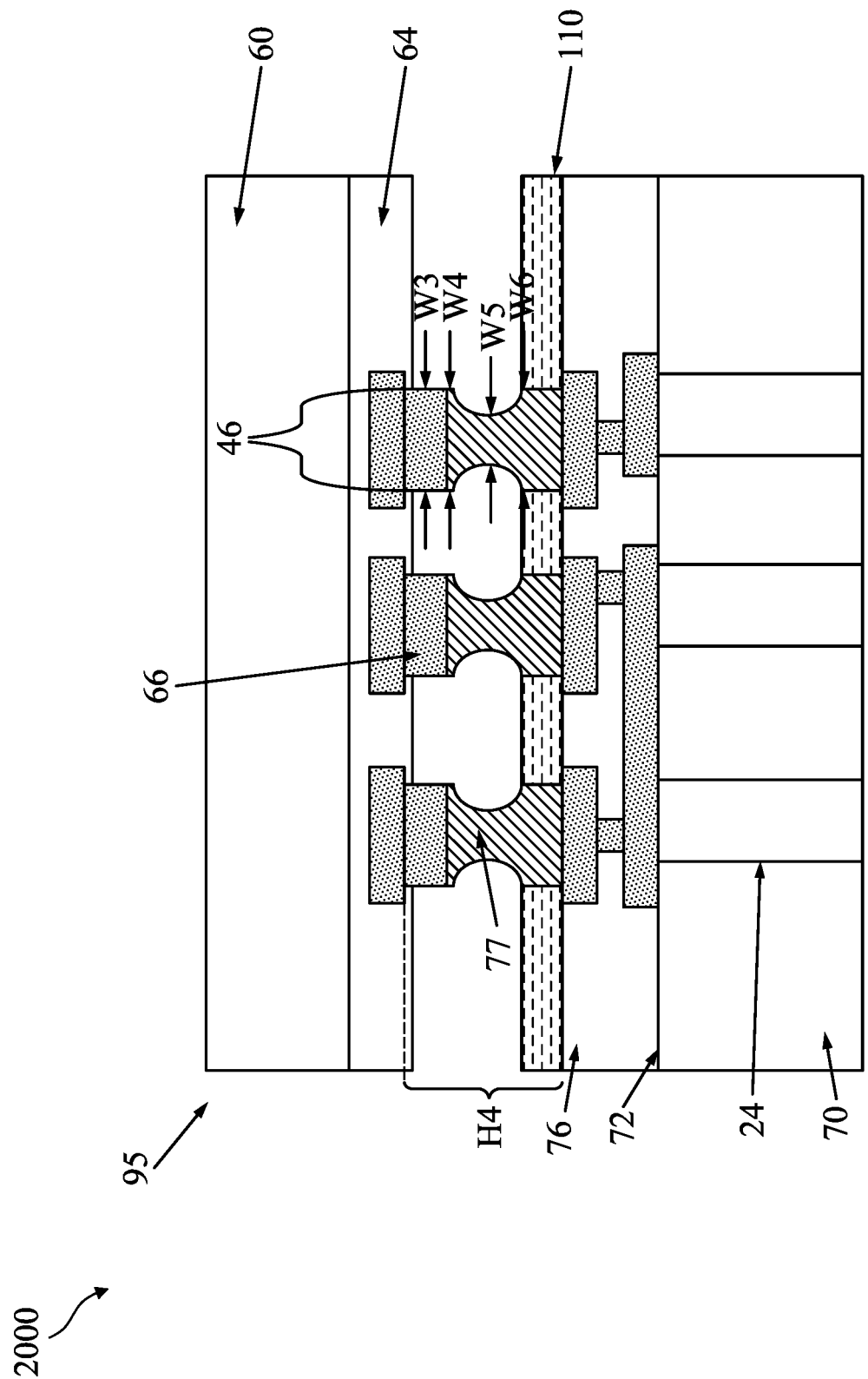

FIG. 12C illustrates a cross-sectional view of the device package 2000 after performing the reflow process and heating process 87 described above in FIGS. 12A and 12B. FIG. 12D shows an enlarged view of the region 95 shown in FIG. 12C. The height between the topmost surface of each die connector 66 and the bottommost surface of a corresponding electrical connector 77 that it is in contact with is equal to the fourth height H4. Because the height between the topmost surface of each die connector 66 and the bottommost surface of a corresponding electrical connector 77 is adjusted (e.g., increased) from the third height H3 to the fourth height H4 during the heating process 87 shown in FIGS. 12A and 12B, an hourglass joint 46 is formed.

The hourglass joint 46 comprises the die connector 66 and the electrical connector 77. The die connector 66 may have a column shape with a uniform third width W3. The electrical connector 77 may comprise an hourglass shape with a first portion of the electrical connector 77 having a fourth width W4, a second portion of the electrical connector 77 having a fifth width W5, and a third portion of the electrical connector 77 having a sixth width W6. The second portion of the electrical connector 77 may be between the first portion and the third portion of the electrical connector 77. In some embodiments, the fifth width W5 is smaller than the fourth width W4 and the sixth width W6. In some embodiments, the third width W3, the fourth width W4, and the sixth width W6 are equal. In some embodiments, the electrical connector 77 may comprise curved, concave sidewalls.

In an embodiment, the third portion of the electrical connector 77 may extend through a solder resist layer 110 on the redistribution structure 76 as shown in FIG. 12D. The third portion of the electrical connector 77 in the solder resist layer 110 may have a substantially uniform width throughout, and the electrical connector 77 may decrease continuously in width in a direction toward a mid-point between the bottommost surface of the die connector 66 and a topmost surface of a solder resist 110. Further, the curved, concave sidewalls of the electrical connector 77 may extend continuously from a topmost surface of the solder resist layer 110 to a bottommost surface of the die connector 66. In an embodiment, the third width W3, the fourth width W4, and the sixth width W6 are not equal (e.g., as shown in FIG. 12I). In an embodiment, one of the third width W3, the fourth width W4, and the sixth width W6 is not equal to the other two widths. In an embodiment, the electrical connector 77 may comprise sidewalls that are curved differently from each other (e.g., as shown in FIG. 12J). In an embodiment, sidewalls of one or more of the die connector 66, the first portion of the electrical connector 77 and the third portion of the electrical connector 77 may be curved or sloping (e.g., as shown in FIG. 12K) In an embodiment where the third portion of the electrical connector 77 is curved or sloping, the third portion of the electrical connector 77 may extend through the solder resist layer 110 on the redistribution structure 76. Flux 78 is then removed (or cleaned) using a method that may comprise spraying solvent, applying de-ionized (DI) water, heating, and drying the device package 2000, in accordance with some embodiments. The next steps of this embodiment are similar to the ones described above in FIG. 7. Accordingly, the process steps and applicable materials may not be repeated herein.

Advantages can be achieved as a result of the formation of the device package 2000 in which the package substrate 40 are be bonded to the die 68 using the electrical connectors 77 on the package substrate 40 that are reflowed using thermal compression bonding (TCB). The thermal compression bonding (TCB) apparatus includes the TCB bonding head 81 that provides the vacuum force 83 to hold the die 68 and the vacuum chuck table 82 that provides the vacuum force 85 to hold the package substrate 40. During the bonding of the package substrate 40 to the die 68, a heating process 87 is performed to reflow the electrical connectors 77 in which the TCB bonding head 81 provides heat to reflow the electrical connectors 77. During the heating process 87, the third height H3 between the topmost surface of each die connector 66 and the bottommost surface of a corresponding electrical connector 77 that it is in contact with is adjusted and increased to the fourth height H4, in order to allow for the formation of the hourglass joint 46. The advantages may include an improvement in the coplanarity (COP) of the device package 2000, and the prevention of deformation or warpage of the die 68 and the package substrate 40 due to the presence of the vacuum forces 83 and 85 during the heating process 87. This improvement in coplanarity and reduced warpage further allows for an improved connection between the package substrate 40 and another component package 44 (e.g., a printed circuit board described above in FIG. 8) when the package substrate 40 and the component package 44 are bonded together.

Figure 12E:
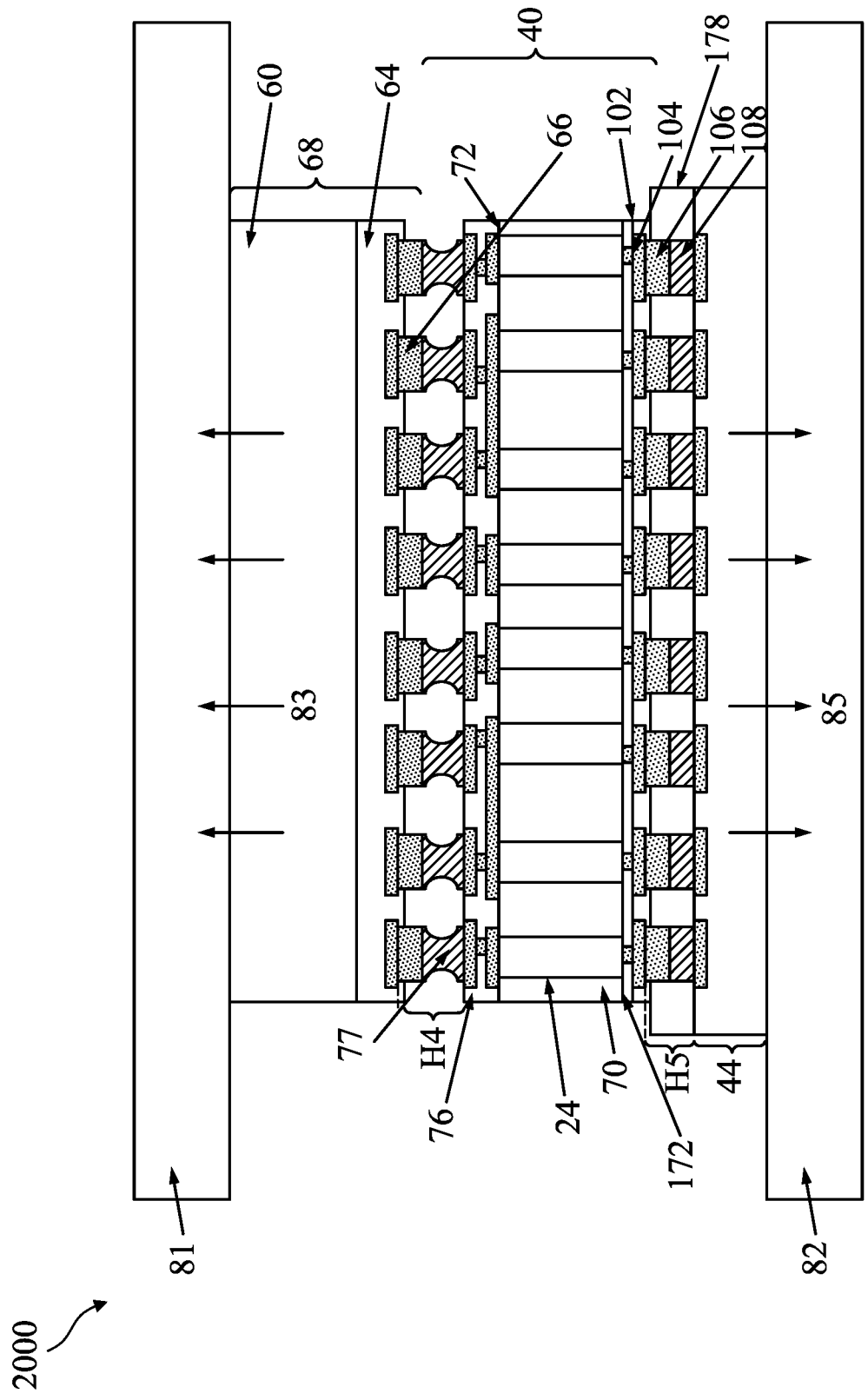
Figure 12F:
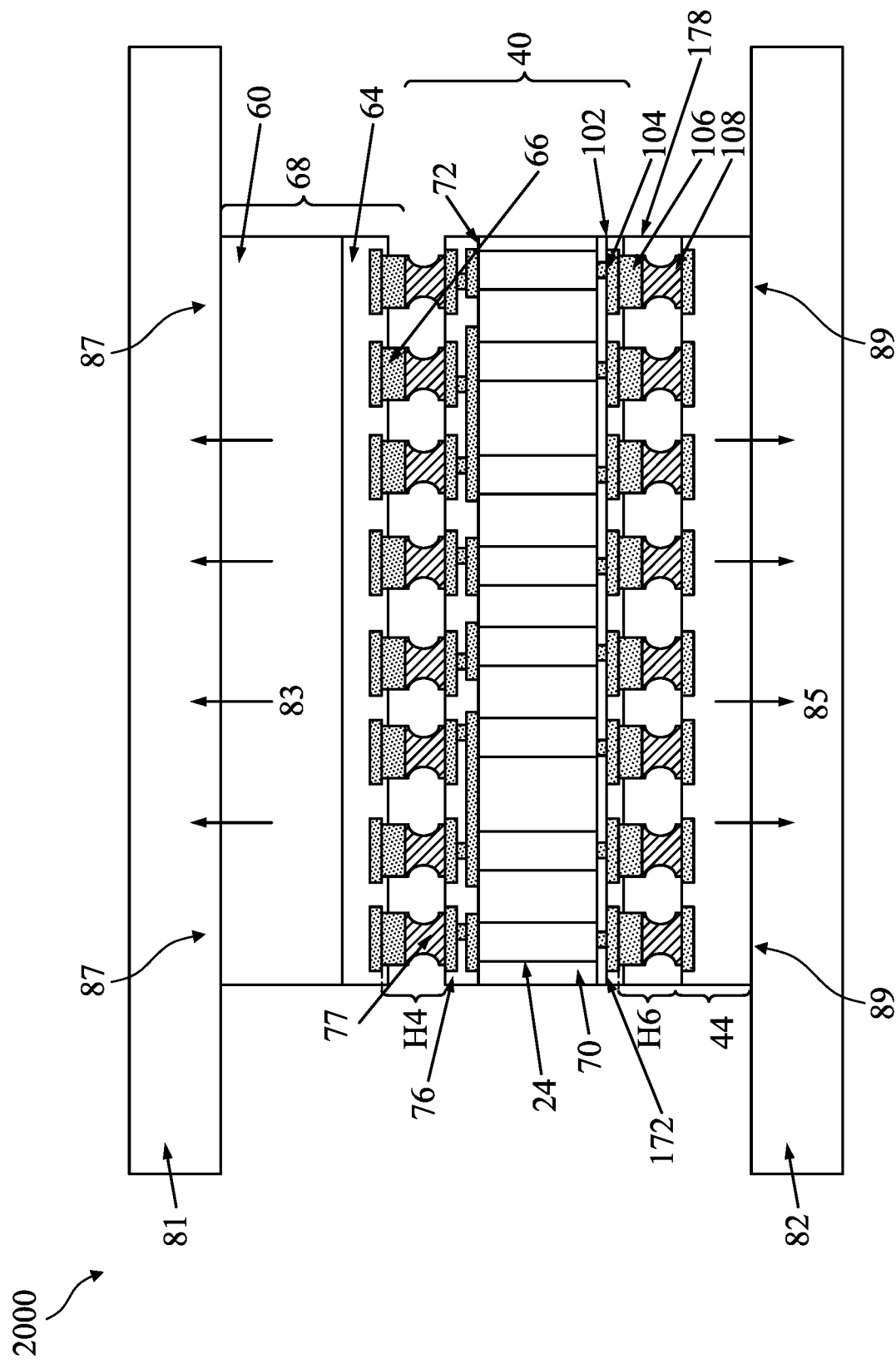

In FIG. 12E through 12H, the component package 44 (described previously in FIG. 8) is attached to the package substrate 40. In FIG. 12E, the electrical connectors 108 of the component package 44 are coated with a flux 178, such as a no-clean flux. The electrical connectors 108 may be dipped in the flux 178 or the flux 178 may be jetted onto the electrical connectors 108. In another embodiment, the flux 178 may also be applied to the electrical connectors 108. TCB bonding head 81 may then be used to pick up the device package 2000 shown in FIG. 12C, and to place the device package 2000 on the component package 44, such that the electrical connectors 108 and the electrical connectors 106 are in contact. The vacuum chuck table 82 may be used to hold the component package 44. After the placement of the device package 2000 on the component package 44, TCB bonding head 81 remains contacting the device package 2000, and may apply an upward force on the device package 2000 due to the vacuum force 83. After the electrical connectors 108 and the electrical connectors 106 are brought into contact, a position of the TCB bonding head 81 relative to the vacuum chuck table 82 may be such that the height between a topmost surface of each electrical connector 106 and a bottommost surface of a corresponding electrical connector 108 that it is in contact with is equal to a fifth height H5. The TCB bonding head 81 is then heated and may provide heat to the device package 2000 in the heating process 87, which by thermal conduction causes the reflow of the electrical connectors 108 and the bonding of the electrical connectors 108 to the electrical connectors 106. In an embodiment, the vacuum chuck table 82 may also heated and may provide heat to the component package 44 in the heating process 89. In an embodiment, the vacuum chuck table 82 includes coils (not shown) that heats up when an electrical current(s) flows through. In an embodiment, the heating process 89 may heat up the vacuum chuck table 82 to a temperature in a range from 25° C. to 400° C. In an embodiment, the heating process 89 may be performed for a duration that is in a range from 0.1 s to 300 s. During the heating processes 87 and 89 and during the melting of the electrical connectors 108, the height between the topmost surface of each electrical connector 66 and the bottommost surface of the corresponding electrical connector 108 that it is in contact with is adjusted to be at a sixth height H6, as shown in FIG. 12F. This may be performed by vertically adjusting the height of the TCB bonding head 81 relative to the vacuum chuck table 82. In some embodiments, the sixth height H6 may be larger than the fifth height H5. For example, a distance between the topmost surfaces of the electrical connectors 106 and the bottommost surfaces of the electrical connectors 108 may be increased. In an embodiment, the fifth height H5 may be in a range from 40 µm to 130 µm and the sixth height H6 may be in a range from 45 µm to 150 µm. In an embodiment, the fifth height H5 may be at least 10 µm. In an embodiment, the sixth height H6 may be at least 10 µm.

Figure 12G:
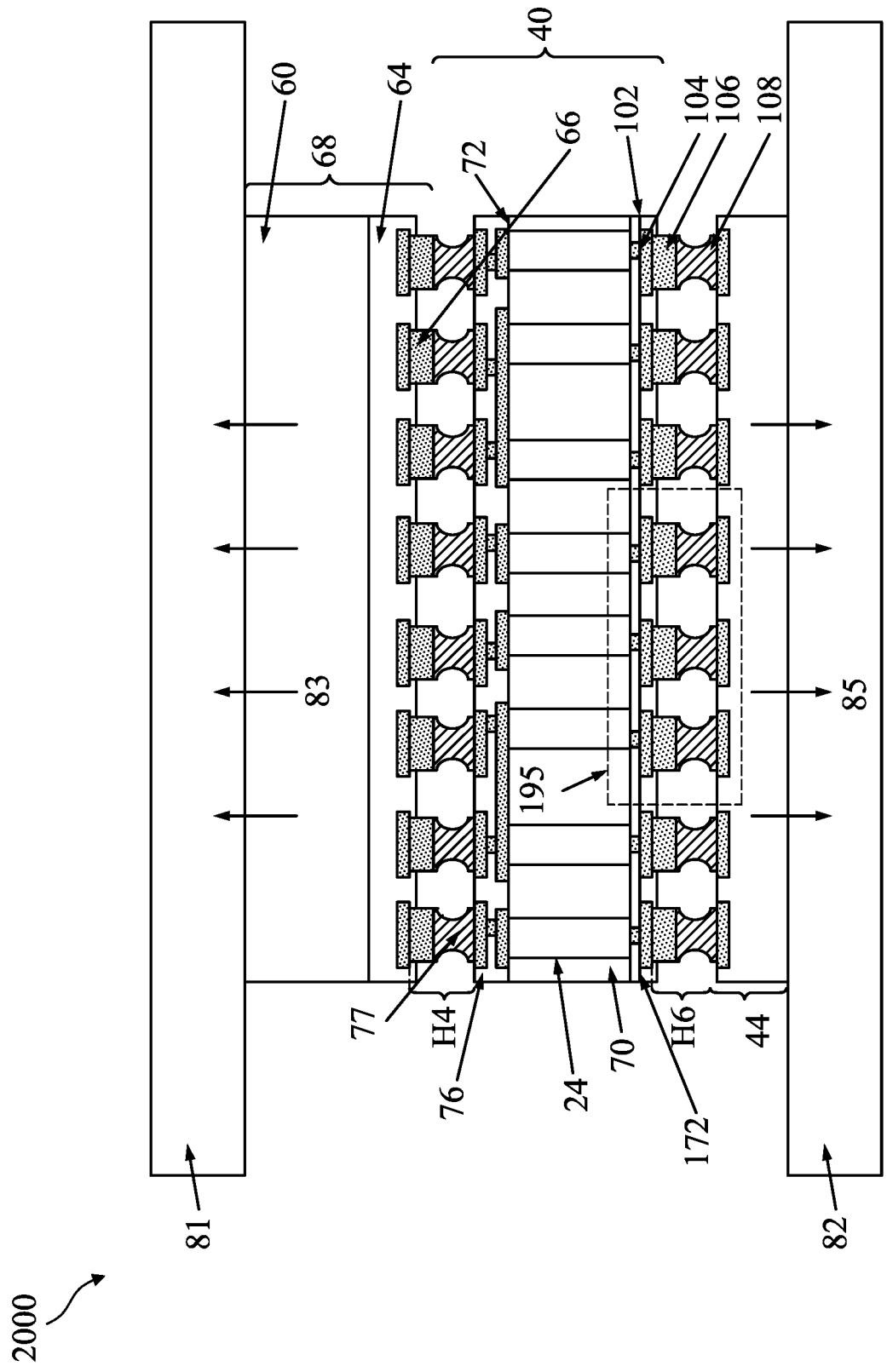
Figure 12H:
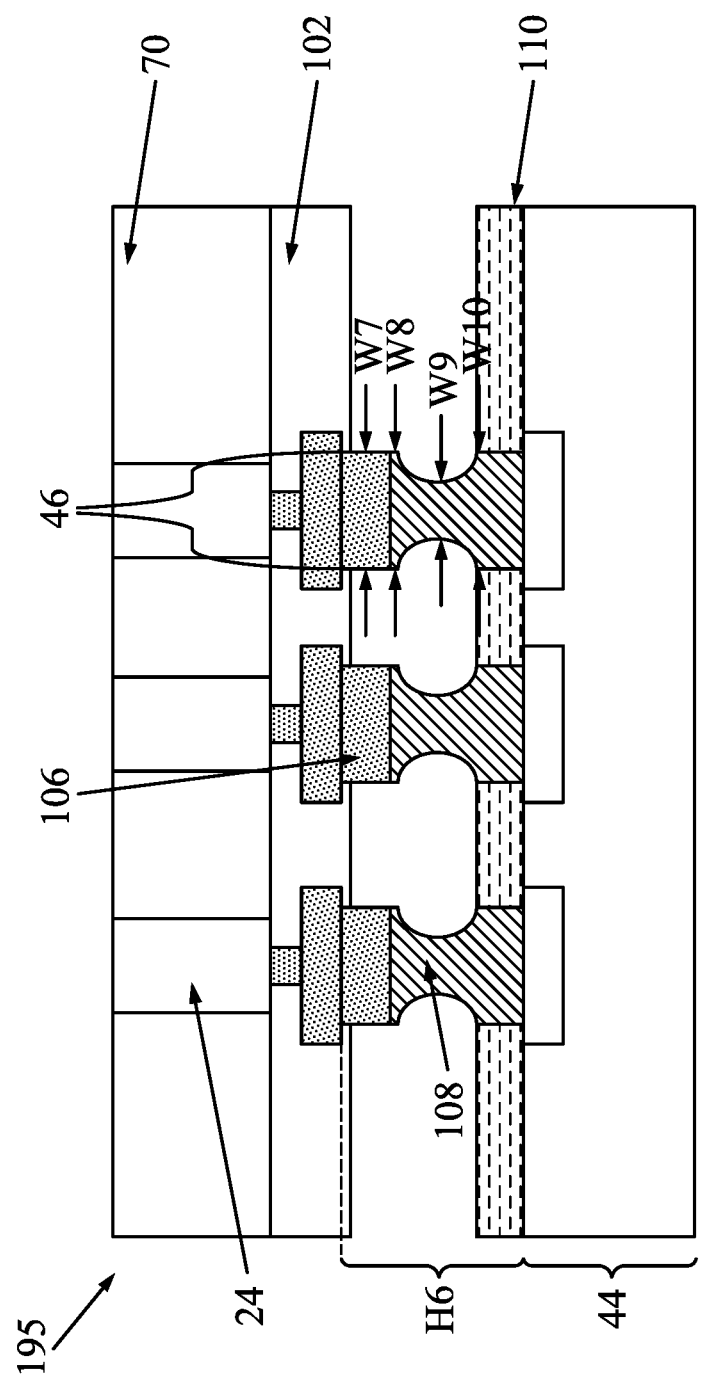
Figure 12I:
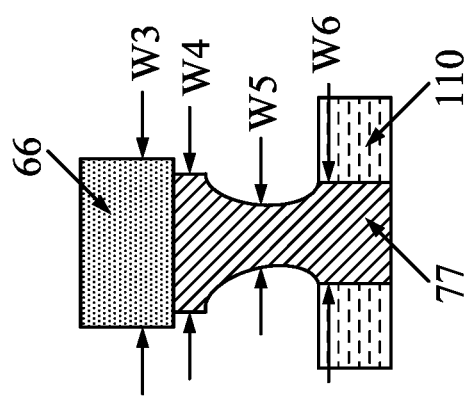
FIGS. 12I, 12J, 12K, 12L, 12M, 12N, 12O, 12P and 12Q illustrate cross-sectional views of solder joints in accordance with alternate embodiments.
Figure 12J:
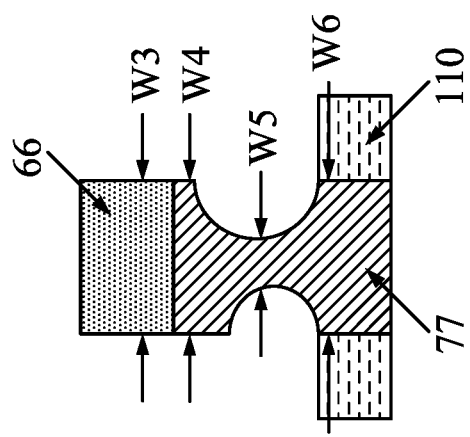
Figure 12K:
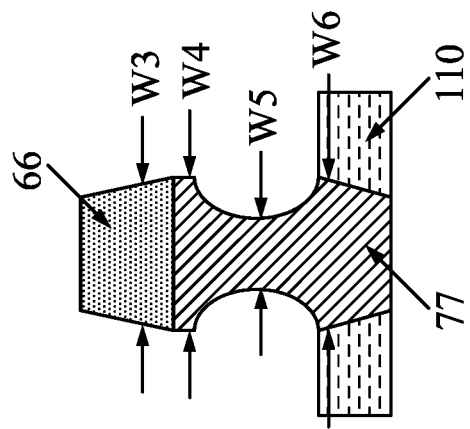
Figure 12L:
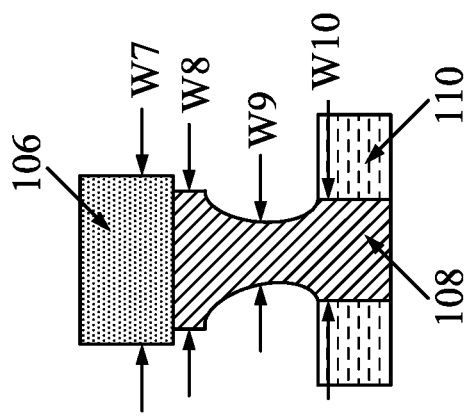
Figure 12M:
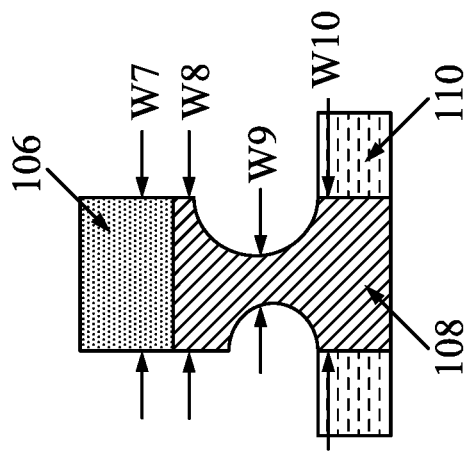
Figure 12N:
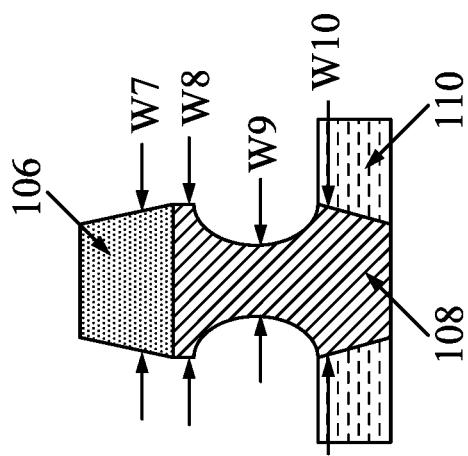

FIG. 12G illustrates a cross-sectional view of the device package 2000 after performing the reflow process and heating process 87 and 89 described above in FIGS. 12E and 12F. FIG. 12H shows an enlarged view of the region 195 shown in FIG. 12G. The height between the topmost surface of each electrical connector 106 and the bottommost surface of a corresponding electrical connector 108 that it is in contact with is equal to the sixth height H6. Because the height between the topmost surface of each electrical connector 106 and the bottommost surface of a corresponding electrical connector 108 is adjusted from the fifth height H5 to the sixth height H6 during the heating process 87 and 89 shown in FIGS. 12E and 12F, an hourglass joint 146 is formed. The hourglass joint 146 comprises the electrical connector 106 and the electrical connector 108. The electrical connector 106 may comprise a column with a uniform seventh width W7. The electrical connector 108 may comprise an hourglass shape with a first portion of the electrical connector 108 having a eighth width W8, a second portion of the electrical connector 108 having a ninth width W9, and a third portion of the electrical connector 108 having a tenth width W10. The second portion of the electrical connector 108 may be in between the first portion and the third portion of the electrical connector 108. In some embodiments, the ninth width W9 is smaller than the eighth width W8 and the tenth width W10. In some embodiments, the seventh width W7, the eighth width W8, and the tenth width W10 are equal. In some embodiments, the electrical connector 108 may comprise curved, concave sidewalls. In an embodiment, the third portion of the electrical connector 108 may extend through a solder resist layer 110 on the component package 44 as shown in FIG. 12H. The third portion of the electrical connector 108 in the solder resist layer 110 may have a substantially uniform width throughout, and the electrical connector 108 may decrease continuously in width in a direction toward a mid-point between the bottommost surface of the electrical connector 106 and a topmost surface of a solder resist 110. Further, the curved, concave sidewalls of the electrical connector 108 may extend continuously from a topmost surface of the solder resist layer 110 to a bottommost surface of the electrical connector 106. In an embodiment, the seventh width W7, the eighth width W8, and the tenth width W10 are not equal (e.g. as shown in FIG. 12L). In an embodiment, one of the seventh width W7, the eighth width W8, and the tenth width W10 is not equal to the other two widths. In an embodiment, the electrical connector 108 may comprise sidewalls that are curved differently from each other (e.g., as shown in FIG. 12M). In an embodiment, sidewalls of one or more of the electrical connector 106, the first portion of the electrical connector 108 and the third portion of the electrical connector 108 may be curved or sloping (e.g. as shown in FIG. 12N). In an embodiment where the third portion of the electrical connector 108 is curved or sloping, the third portion of the electrical connector 108 may extend through the solder resist layer 110 on the component package 44. Flux 178 is then removed (or cleaned) using a method that may comprise spraying solvent, applying de-ionized (DI) water, heating, and drying the device package 2000, in accordance with some embodiments. An underfill material (not shown) can be dispensed between the component package 44 and the package substrate 40. The underfill material may be any acceptable material, such as a polymer, epoxy, molding underfill, or the like. In an alternate embodiment, the component package 44 (described previously in FIG. 8) may be attached to the package substrate 40 using the steps described in FIGS. 8 through 11. Accordingly, the process steps and applicable materials may not be repeated herein.

Figure 13A:
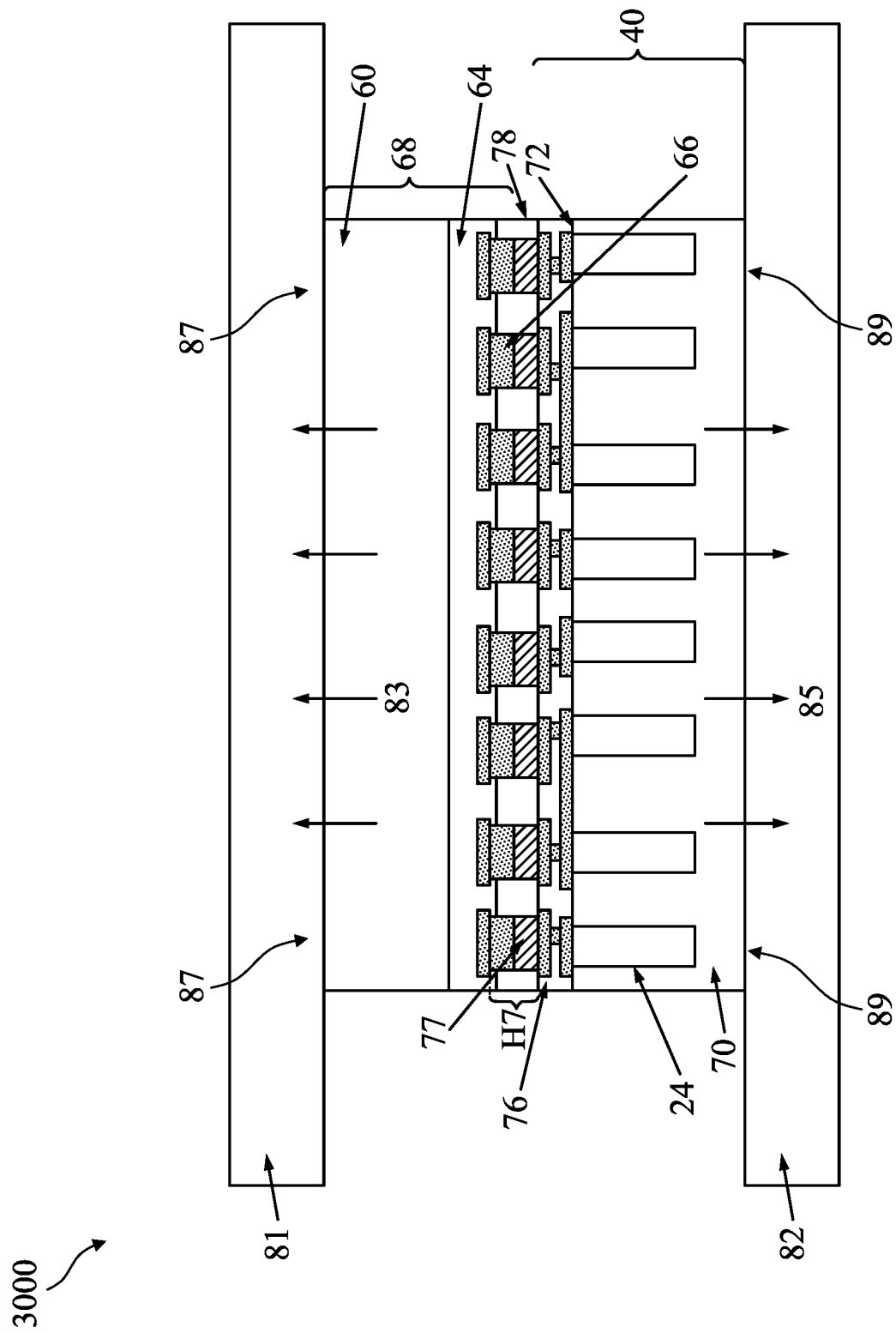
FIGS. 13A, 13B, 13C illustrate cross-sectional views of intermediary stages of manufacturing a semiconductor device package 3000 in accordance with alternate embodiments.
Figure 13B:
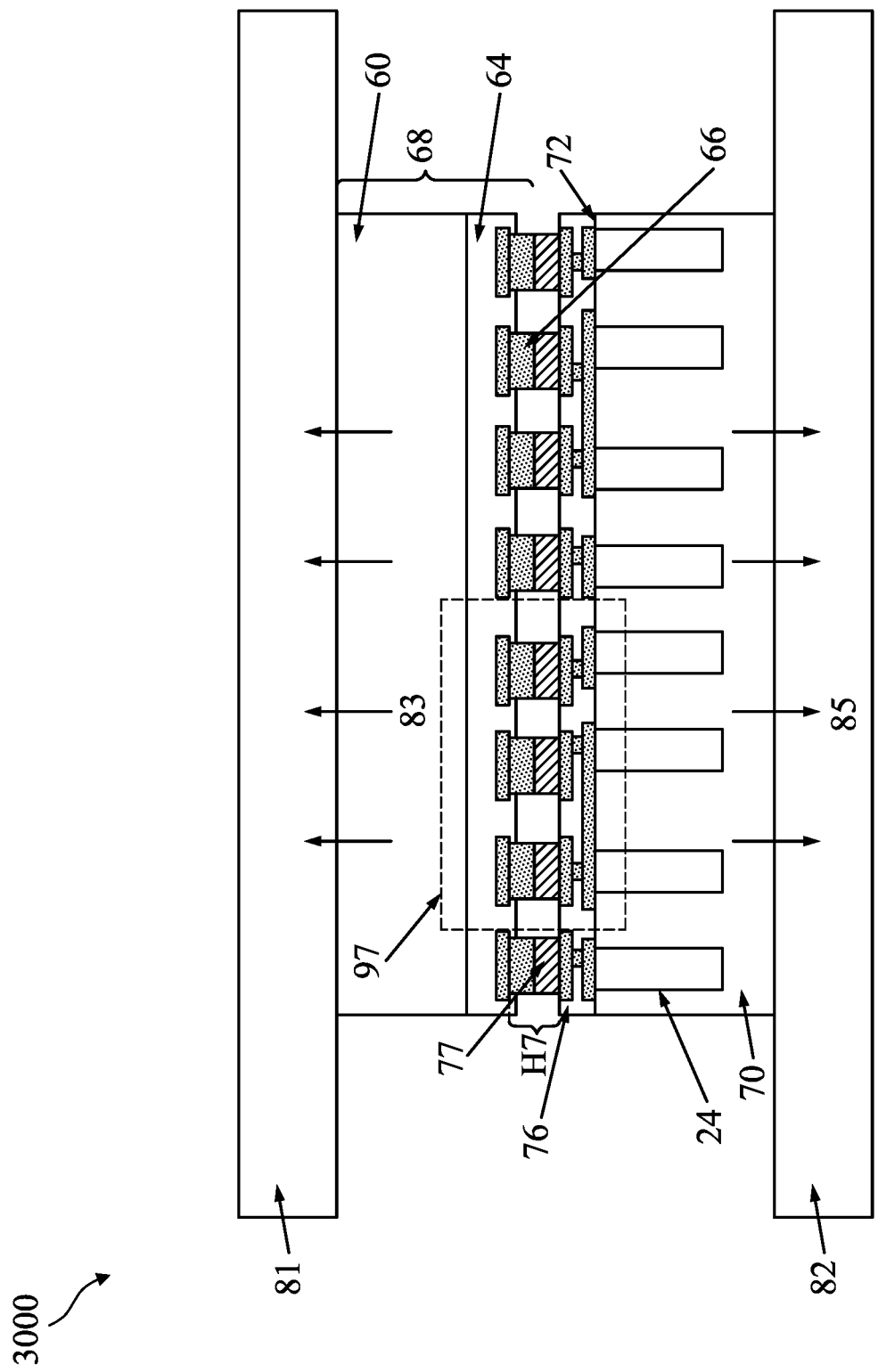
Figure 13C:
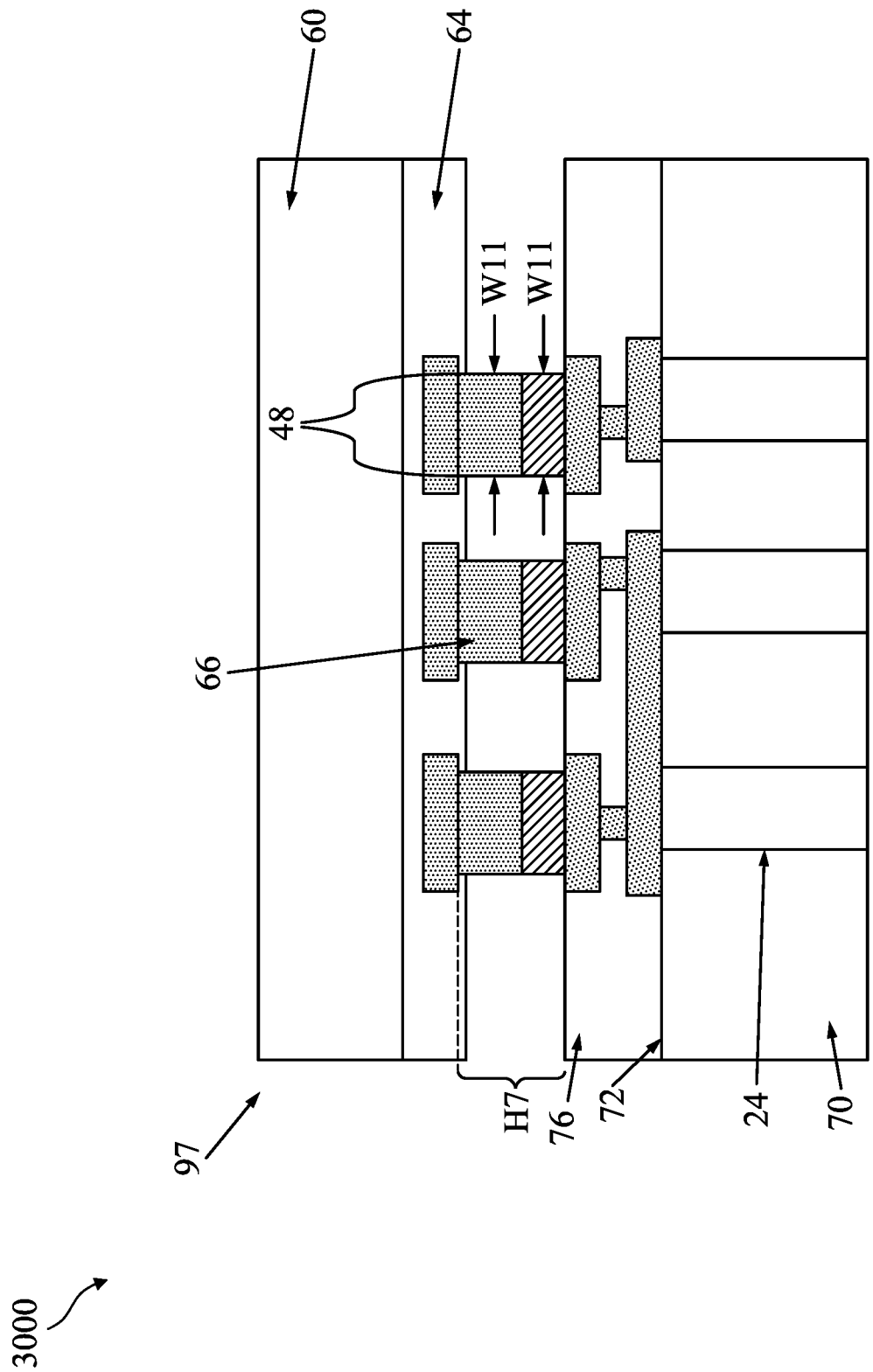

FIGS. 13A, 13B, and 13C illustrate cross-sectional views of intermediary stages of manufacturing a semiconductor device package 3000, in accordance with some embodiments. The device package 3000 is another embodiment in which like reference numerals represent like components in the embodiment shown in FIGS. 1 through 11, unless specified otherwise. Accordingly, the process steps and applicable materials may not be repeated herein. The initial steps of this embodiment are essentially the same as shown in FIGS. 1 through 5.

In FIG. 13A, TCB bonding head 81 may be used to pick up the die 68, and to place the die 68 on the package substrate 40, such that the electrical connectors 77 and the die connectors 66 are in contact. After the placement of the die 68 on the package substrate 40, TCB bonding head 81 remains contacting the die 68, and may apply an upward force on the die 68 due to the vacuum force 83 A position of the TCB bonding head 81 relative to the vacuum chuck table 82 may be maintained such that a height between a topmost surface of each die connector 66 and a bottommost surface of a corresponding electrical connector 77 that it is in contact with is equal to a seventh height H7. The TCB bonding head 81 is then heated and may provide heat to the die 68 in a heating process 87, and the vacuum chuck table 82 is also heated and may provide heat to the package substrate 40 in a heating process 89. The heating processes 87 and 89 may by thermal conduction cause the reflow of the electrical connectors 77 and the bonding of the electrical connectors 77 to the die connectors 66. In an embodiment, the TCB bonding head 81 includes coils (not shown) that heats up when an electrical current(s) flows through. In an embodiment, the heating process 87 may heat up the TCB bonding head 81 and the die 68 to a temperature in a range from 25° C. to 400° C. In an embodiment, the heating process 87 may be performed for a duration that is in a range from 0.1 s to 300 s. In an embodiment, the vacuum chuck table 82 includes coils (not shown) that heats up when an electrical current(s) flows through. In an embodiment, the heating process 89 may heat up the vacuum chuck table 82 to a temperature in a range from 25° C. to 400° C. In an embodiment, the heating process 89 may be performed for a duration that is in a range from 0.1 s to 300 s. During the heating processes 87 and 89, and during the melting of the electrical connectors 77, the height between the topmost surface of each die connector 66 and the bottommost surface of the corresponding electrical connector 66 is maintained at the seventh height H7 by holding the TCB bonding head 81 at a fixed vertical position relative to the vacuum chuck table 82. In an embodiment, the seventh height H7 may be in a range from 5 μm to 60 μm. In an embodiment, the seventh height h7 may be up to 100 μm.

FIG. 13B illustrates a cross-sectional view of the device package 3000 after performing the reflow process and heating processes 87 and 89 described above in FIG. 13A. FIG. 13C shows an enlarged view of the region 97 shown in FIG. 13B. The height between the topmost surface of each die connector 66 and the bottommost surface of a corresponding electrical connector 77 that it is in contact with is equal to the seventh height H7. Because the seventh height H7 is maintained during the heating processes 87 and 89 shown in FIG. 13A, a column joint 48 is formed that has a uniform eleventh width W11 throughout an entirety of the seventh height H7 of the column joint 48. For example, the die connector 66 may have a cylindrical shape that has a uniform width equal to the eleventh width W11, and the reflowed electrical connector 77 may likewise have a cylindrical shape that has uniform width equal to the eleventh width W11. Flux 78 is then removed (or cleaned) using a method that may comprise spraying solvent, applying de-ionized (DI) water, heating, and drying the device package 3000, in accordance with some embodiments. The next steps of this embodiment are essentially the same as shown in FIG. 7. Accordingly, the process steps and applicable materials may not be repeated herein.

After the formation of the redistribution structure 102 and the electrical connectors 106 in the manner described in FIG. 7, the component package 44 (described previously in FIG. 8) is attached to the package substrate 40. In an embodiment, the component package 44 is attached to the package substrate 40 in the manner described in FIGS. 8 through 11, In an alternate embodiment, the component package 44 is attached to the package substrate 40 in the manner described in FIGS. 12E through 12H. Accordingly, the process steps and applicable materials may not be repeated herein.

Advantages can be achieved as a result of the formation of the device package 3000 in which the package substrate 40 are bonded to the die 68 using the electrical connectors 77 on the package substrate 40 that are reflowed using thermal compression bonding (TCB). The thermal compression bonding (TCB) apparatus includes the TCB bonding head 81 that provides the vacuum force 83 to hold the die 68 and the vacuum chuck table 82 that provides the vacuum force 85 to hold the package substrate 40. During the bonding of the package substrate 40 to the die 68, a heating process 87 and a heating process 89 is performed to reflow the electrical connectors 77 in which the TCB bonding head 81 and the vacuum chuck table 82 provide heat to reflow the electrical connectors 77. During the heating processes 87 and 89, the seventh height H7 between the topmost surfaces of the die connectors 66 and the bottommost surfaces of the electrical connectors 77 are maintained at a constant in order to allow for the formation of the column joint 48. The advantages may include an improvement in the coplanarity (COP) of the device package 3000, and the prevention of deformation or warpage of the die 68 and the package substrate 40 due to the presence of the vacuum forces 83 and 85 during the heating processes 87 and 89. This improvement in coplanarity and reduced warpage further allows for an improved connection between the package substrate 40 and another component package 44 (e.g., a printed circuit board described above in FIG. 8) when the package substrate 40 and the component package 44 are bonded together.

FIGS. 14A, 14B, 14C and 14D illustrate cross-sectional views of intermediary stages of manufacturing a semiconductor device package 4000, in accordance with some embodiments. The device package 4000 is another embodiment in which like reference numerals represent like components in the embodiment shown in FIGS. 1 through 11, unless specified otherwise. Accordingly, the process steps and applicable materials may not be repeated herein. The initial steps of this embodiment are essentially the same as shown in FIGS. 1 through 5.

Figure 14A:
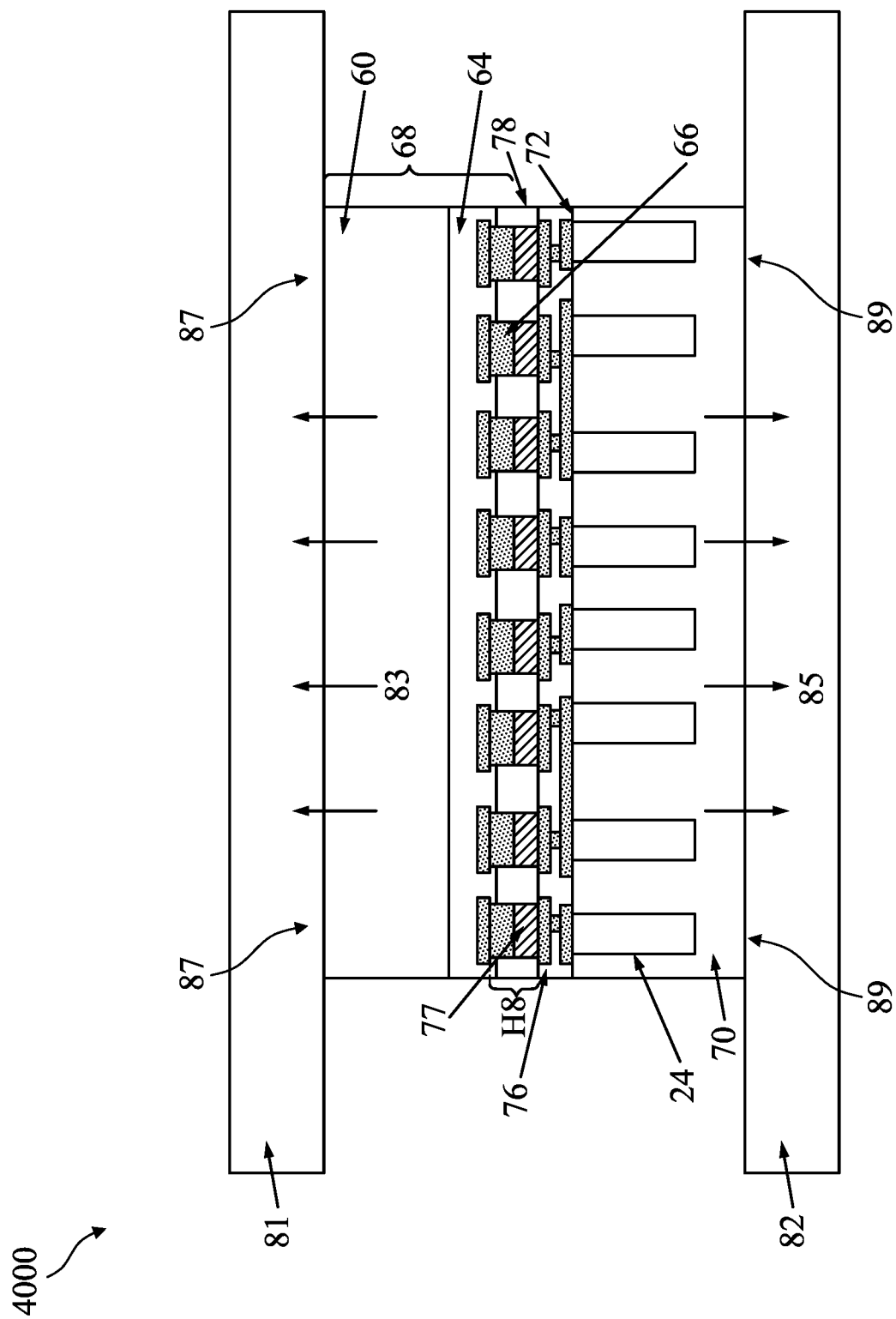
FIGS. 14A, 14B, 14C and 14D illustrate cross-sectional views of intermediary stages of manufacturing a semiconductor device package 4000 in accordance with alternate embodiments.
Figure 14B:
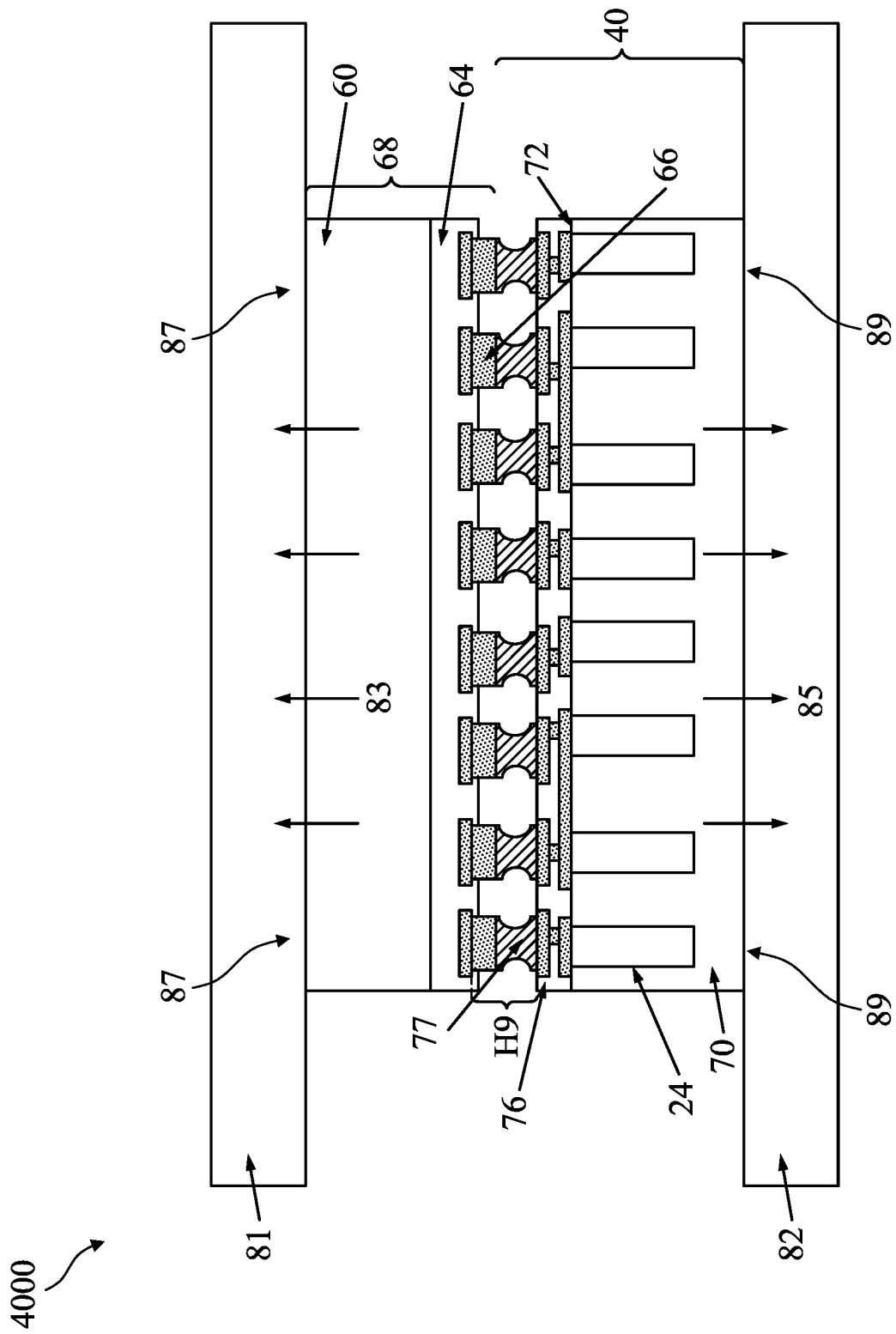

In FIG. 14A, TCB bonding head 81 may be used to pick up the die 68, and to place the die 68 on the package substrate 40, such that the electrical connectors 77 and the die connectors 66 are in contact. After the placement of the die 68 on the package substrate 40, TCB bonding head 81 remains contacting the die 68, and may apply an upward force on the die 68 due to the vacuum force 83. After the electrical connectors 77 and the die connectors 66 are brought into contact, a position of the TCB bonding head 81 relative to the vacuum chuck table 82 may be such that a the height between a topmost surface of each die connector 66 and a bottommost surface of a corresponding electrical connector 77 that it is in contact with is equal to an eighth height H8. The TCB bonding head 81 is then heated and may provide heat to the die 68 in a heating process 87, and the vacuum chuck table 82 is also heated and may provide heat to the package substrate 40 in a heating process 89. The heating processes 87 and 89 may by thermal conduction cause the reflow of the electrical connectors 77 and the bonding of the electrical connectors 77 to the die connectors 66. In an embodiment, the TCB bonding head 81 includes coils (not shown) that heats up when an electrical current(s)

flows through. In an embodiment, the heating process 87 may heat up the TCB bonding head 81 to a temperature in a range from 25° C. to 400° C. In an embodiment, the heating process 87 may be performed for a duration that is in a range from 0.1 s to 300 s. In an embodiment, the vacuum chuck table 82 includes coils (not shown) that heats up when an electrical current(s) flows through. In an embodiment, the heating process 89 may heat up the vacuum chuck table 82 to a temperature in a range from 25° C. to 400° C. In an embodiment, the heating process 89 may be performed for a duration that is in a range from 0.1 s to 400 s. During the heating processes 87 and 89, and during the melting of the electrical connectors 77, the height between the topmost surface of each die connector 66 and the bottommost surface of the corresponding electrical connector 66 that it is in contact with is adjusted to be at a ninth height H9, as shown in FIG. 14B. This may be performed by vertically adjusting the height of the TCB bonding head 81 relative to the vacuum chuck table 82. In some embodiments, the ninth height H9 may be larger than the eighth height H8. For example, a distance between the topmost surfaces of the die connectors 66 and the bottommost surfaces of the electrical connectors 77 may be increased. In an embodiment, the eighth height H8 may be in a range from 5 µm to 60 µm and the ninth height H9 may be in a range from 7 µm to 70 µm. In an embodiment, the eighth height H8 may be up to 100 µm. In an embodiment, the ninth height H9 may be up to 100 µm.

Figure 12Q:
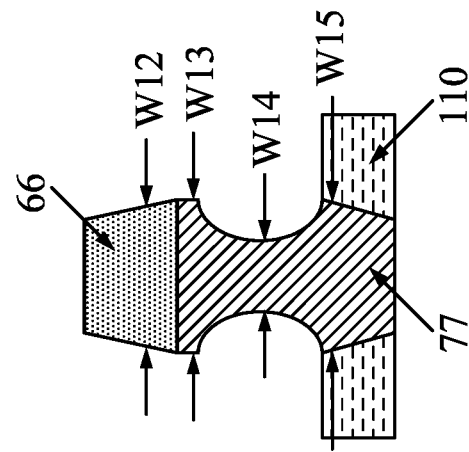
Figure 12P:
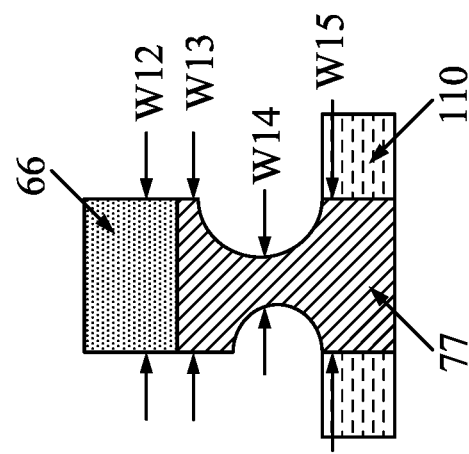
Figure 12O:
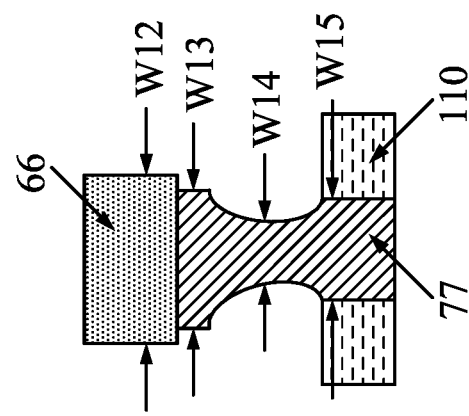
Figure 14C:
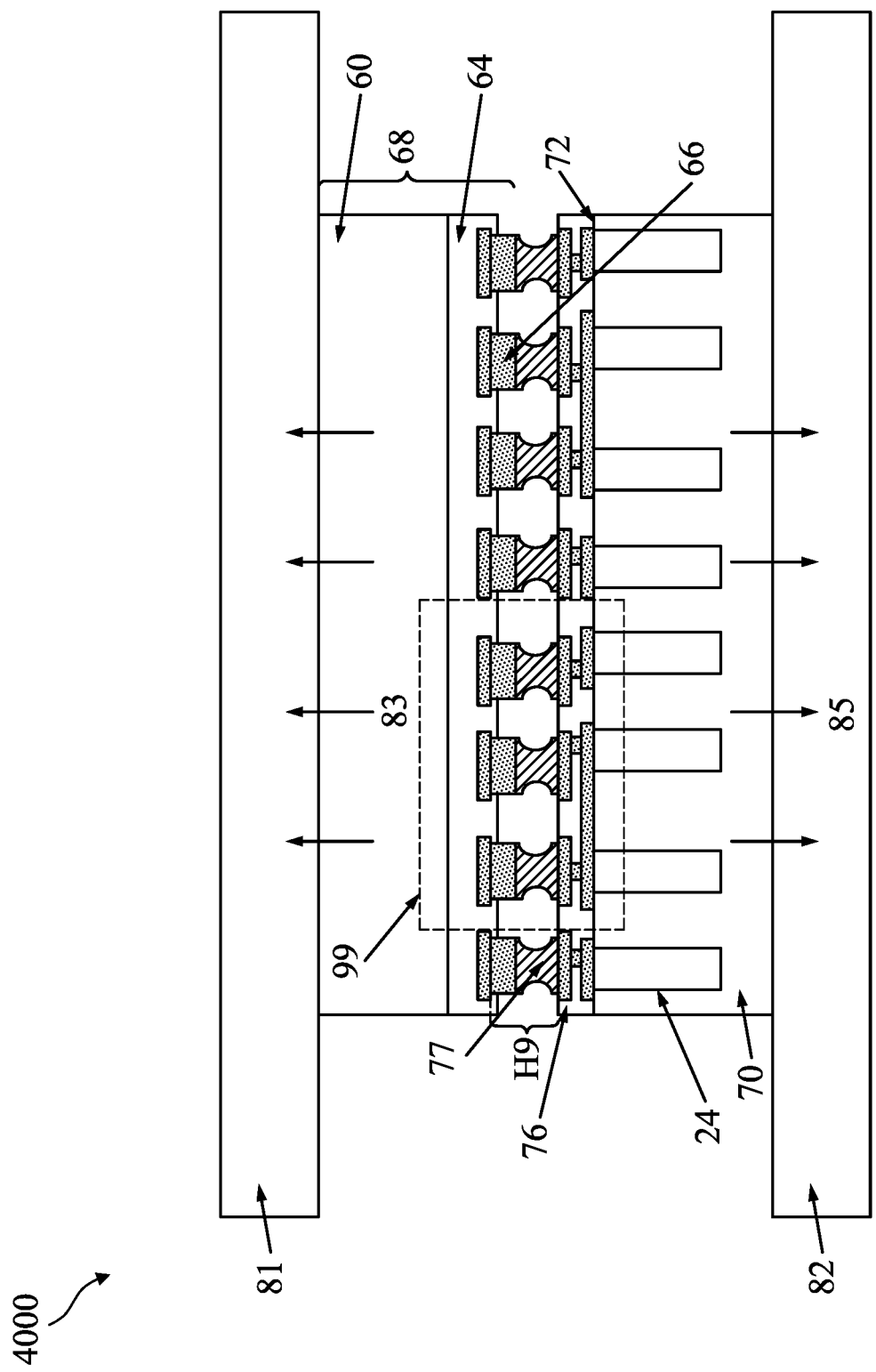
Figure 14D:
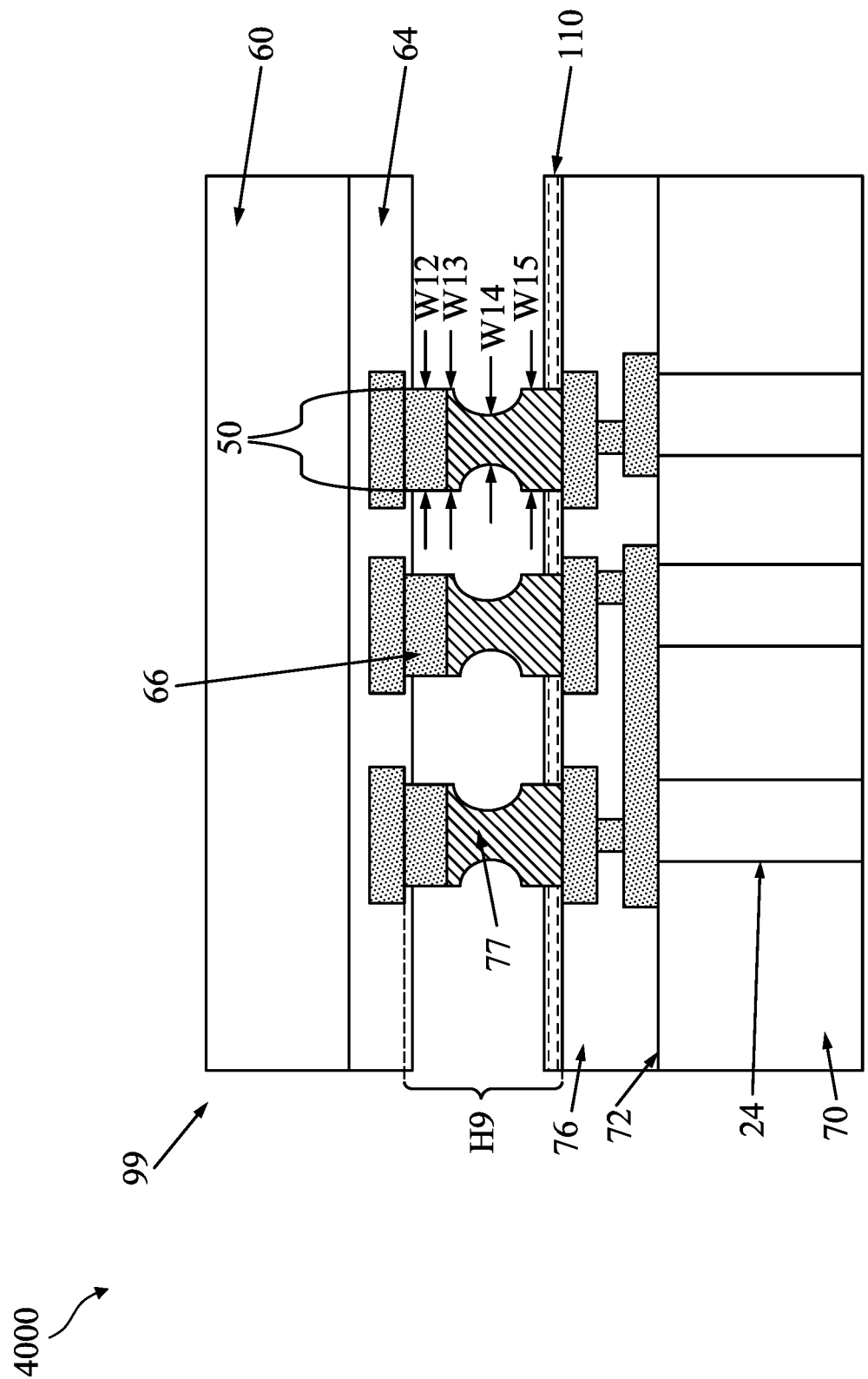

FIG. 14C illustrates a cross-sectional view of the device package 4000 after performing the reflow process and heating processes 87 and 89 described above in FIGS. 14A and 14B. FIG. 14D shows an enlarged view of the region 99 shown in FIG. 14C. The height between the topmost surface of each die connector 66 and the bottommost surface of a corresponding electrical connector 77 that it is in contact with is equal to the ninth height H9. Because the height between the topmost surface of each die connector 66 and the bottommost surface of a corresponding electrical connector 77 is adjusted from the eighth height H8 to the ninth height H9 during the heating processes 87 and 89 shown in FIGS. 14A and 14B, an hourglass joint 50 is formed. The hourglass joint 50 comprises the die connector 66 and the electrical connector 77. The die connector 66 may comprise a column with a uniform twelfth width W12. The electrical connector 77 may comprise an hourglass shape with a first portion of the electrical connector 77 having a thirteenth width W13, a second portion of the electrical connector 77 having a fourteenth width W14, and a third portion of the electrical connector having a fifteenth width W15. The second portion of the electrical connector 77 may be in between the first portion and the third portion of the electrical connector 77. In some embodiments, the fourteenth width W14 is smaller than the thirteenth width W13 and the fifteenth width W15. In some embodiments, the twelfth width W12, the thirteenth width W13, and the fifteenth width W15 are equal. In some embodiments, the electrical connector 77 may comprise curved, concave sidewalls. In an embodiment, the third portion of the electrical connector 77 may extend through a solder resist layer 110 on the redistribution structure 76 as shown in FIG. 14D. The third portion of the electrical connector 77 in the solder resist layer 110 may have a substantially uniform width throughout, and the electrical connector 77 may decrease continuously in width in a direction toward a mid-point between the bottommost surface of the die connector 66 and a topmost surface of a solder resist 110. Further, the curved, concave sidewalls of the electrical connector 77 may extend continuously from a topmost surface of the solder resist layer 110 to a bottommost surface of the die connector 66. In an embodiment, the twelfth width W12, the thirteenth width W13, and the fifteenth width W15 are not equal (e.g., as shown in FIG. 12O). In an embodiment, one of the twelfth width W12, the thirteenth width W13, and the fifteenth width W15 is not equal to the other two widths. In an embodiment, the electrical connector 77 may comprise sidewalls that are curved differently from each other (e.g., as shown in FIG. 12P). In an embodiment, sidewalls of one or more of the die connector 66, the first portion of the electrical connector 77 and the third portion of the electrical connector 77 may be curved or sloping (e.g., as shown in FIG. 12Q). In an embodiment where the third portion of the electrical connector 77 is curved or sloping, the third portion of the electrical connector 77 may extend through the solder resist layer 110 on the redistribution structure 76. Flux 78 is then removed (or cleaned) using a method that may comprise spraying solvent, applying de-ionized (DI) water, heating, and drying the device package 4000, in accordance with some embodiments. The next steps of this embodiment are essentially the same as shown in FIG. 7. Accordingly, the process steps and applicable materials may not be repeated herein.

After the formation of the redistribution structure 102 and the electrical connectors 106 in the manner described in FIG. 7, the component package 44 (described previously in FIG. 8) is attached to the package substrate 40. In an embodiment, the component package 44 is attached to the package substrate 40 in the manner described in FIGS. 8 through 11, In an alternate embodiment, the component package 44 is attached to the package substrate 40 in the manner described in FIGS. 12E through 12H. Accordingly, the process steps and applicable materials may not be repeated herein.

Advantages can be achieved as a result of the formation of the device package 4000 in which the package substrate 40 is be bonded to the die 68 using the electrical connectors 77 on the package substrate 40 that are reflowed using thermal compression bonding (TCB). The thermal compression bonding (TCB) apparatus comprises the TCB bonding head 81 that provides the vacuum force 83 to hold the die 68 and the vacuum chuck table 82 that provides the vacuum force 85 to hold the package substrate 40. During the bonding of the package substrate 40 to the die 68, a heating process 87 and a heating process 89 are performed to reflow the electrical connectors 77 in which the TCB bonding head 81 and the vacuum chuck table 82 provide heat to reflow the electrical connectors 77. During the heating processes 87 and 89, the eighth height H8 between the topmost surface of each die connector 66 and the bottommost surface of a corresponding electrical connector 77 that it is in contact with is increased to the ninth height H9, in order to allow for the formation of the hourglass joint 50. The advantages may include an improvement in the coplanarity (COP) of the device package 4000, and the prevention of deformation or warpage of the die 68 and the package substrate 40 due to the presence of the vacuum forces 83 and 85 during the heating processes 87 and 89. This improvement in coplanarity and reduced warpage further allows for an improved connection between the package substrate 40 and another component package 44 (e.g., a printed circuit board described above in FIG. 8) when the package substrate 40 and the component package 44 are bonded together.

The embodiments of the present disclosure have some advantageous features. The embodiments include the formation of a device package comprising one or more semiconductor chips bonded to an interposer and a package substrate bonded to a side of the interposer opposing the one or more semiconductor chips. The interposer may be bonded to the one or more semiconductor chips using solder bumps on the semiconductor chip(s) and/or the interposer that are reflowed using thermal compression bonding (TCB). During the bonding of the interposer to the semiconductor chip, a heating process is performed to reflow the solder bumps in which a TCB bonding head and a vacuum chuck table provide heat to reflow the solder bumps. During the heating process, the height of the solder bumps can be maintained to allow for the formation of solder bumps with a column shape, or the height of the solder bumps can be increased to allow for the formation of solder bumps with an hourglass shape. As a result, one or more embodiments disclosed herein allow for an improvement in the device package coplanarity (COP), and a reduction in warpage. This improvement in coplanarity and reduced warpage also allows for an improved connection between the package substrate (e.g., a printed circuit board) and the interposer when the package substrate and the interposer are bonded together.

In accordance with an embodiment, a method includes attaching a die to a thermal compression bonding (TCB) head through vacuum suction, where the die includes a plurality of conductive pillars; attaching a first substrate to a chuck through vacuum suction, where the first substrate includes a plurality of solder bumps; contacting a first conductive pillar of the plurality of conductive pillars to a first solder bump of the plurality of solder bumps, where contacting the first conductive pillar to the first solder bump results in a first height between a topmost surface of the first conductive pillar and a bottommost surface of the first solder bump; and adhering the first solder bump to the first conductive pillar to form a first joint, where adhering the first solder bump to the first conductive pillar includes heating the TCB head. In an embodiment, the method further includes jetting a flux over the first substrate, where the flux coats the plurality of solder bumps on the first substrate; and removing the flux after adhering the first solder bump to the first conductive pillar. In an embodiment, after adhering the first solder bump to the first conductive pillar, a lower portion of the first solder bump extends through a solder resist layer, the lower portion of the first solder bump having a uniform width throughout. In an embodiment, during heating the TCB head the vertical position of the TCB head relative to the chuck is adjusted such that the topmost surface of the first conductive pillar is disposed a second height from the bottommost surface of the first solder bump, where the second height is larger than the first height. In an embodiment, during heating the TCB head the height between the topmost surface of the first conductive pillar and the bottommost surface of the first solder bump is maintained at the first height by maintaining the vertical position of the TCB head relative to the chuck. In an embodiment, adhering the first solder bump to the first conductive pillar further includes heating the chuck. In an embodiment, the first joint has an hourglass shape.

In accordance with an embodiment, a method includes bonding a first side of a first die to a first side of a first substrate, where the first substrate includes a first plurality of solder bumps on the first side of the first substrate, and the first die includes a first plurality of conductive pillars on the first side of the first die, where bonding the first side of the first die to the first side of the first substrate includes attaching the first die to a thermal compression bonding (TCB) head through vacuum suction; attaching the first substrate to a chuck through vacuum suction; adjusting the vertical distance of the TCB head relative to the chuck to initiate contact between a first conductive pillar of the first plurality of conductive pillars and a first solder bump of the first plurality of solder bumps; and heating the TCB head and the chuck to adhere the first conductive pillar to the first solder bump and form a first joint, where during the heating the TCB head and the chuck, the vertical distance of the TCB head relative to the chuck is increased. In an embodiment, after adhering the first conductive pillar to the first solder bump to form the first joint, the first solder bump includes curved, concave sidewalls. In an embodiment, after adhering the first conductive pillar to the first solder bump to form the first joint, the first solder bump and the first conductive pillar include sloping sidewalls. In an embodiment, where after adhering the first conductive pillar to the first solder bump, a lower portion of the first solder bump extends through a solder resist layer, and where the first solder bump decreases continuously in width in a direction toward a mid-point between a bottommost surface of the first conductive pillar and a topmost surface of the solder resist layer. In an embodiment, the method further includes bonding a second side of the first substrate to a first side of a component package. In an embodiment, bonding the second side of the first substrate to the first side of the component package includes attaching the first die and the first substrate to a TCB head through vacuum suction, where the first substrate includes a second plurality of conductive pillars on the second side of the first substrate; attaching the component package to a chuck through vacuum suction, where the component package includes a second plurality of solder bumps on the first side of the component package; adjusting the vertical distance of the TCB head relative to the chuck to initiate contact between a second conductive pillar of the second plurality of conductive pillars and a second solder bump of the second plurality of solder bumps; and heating the TCB head and the chuck to adhere the second conductive pillar to the second solder bump and form a second joint, where during the heating the TCB head and the chuck the vertical distance of the TCB head relative to the chuck is maintained. In an embodiment, bonding the second side of the first substrate to the first side of the component package includes attaching the first die and the first substrate to a TCB head through vacuum suction, where the first substrate includes a third plurality of conductive pillars on the second side of the first substrate; attaching the component package to a chuck through vacuum suction, where the component package includes a third plurality of solder bumps on the first side of the component package; adjusting the vertical distance of the TCB head relative to the chuck to initiate contact between a third conductive pillar of the third plurality of conductive pillars and a third solder bump of the third plurality of solder bumps; and heating the TCB head and the chuck to adhere the third conductive pillar to the third solder bump and form a third joint, where during the heating the TCB head and the chuck, the vertical distance of the TCB head relative to the chuck such is increased. In an embodiment, after adhering the third conductive pillar to the third solder bump to form the third joint the third solder bump includes curved, concave sidewalls. In an embodiment, the concave sidewalls of the third solder bump are curved differently from each other.

In accordance with an embodiment, a package includes a first die; a first substrate bonded to the first die using a plurality of first conductive connectors, where each of the plurality of first conductive connectors includes a first conductive pillar adhered to a first solder bump, where each of the plurality of first conductive connectors includes an hourglass shape, where a lower portion of the first solder bump extends through a solder resist layer, and where the first solder bump decreases continuously in width in a direction toward a mid-point between a bottommost surface of the first conductive pillar and a topmost surface of the solder resist layer; and a second substrate bonded to the first substrate using a plurality of second conductive connectors. In an embodiment, each of the plurality of second conductive connectors includes a second conductive pillar adhered to a second solder bump, and where each of the plurality of second conductive connectors includes an hourglass shape. In an embodiment, each of the plurality of second conductive connectors includes a third conductive pillar adhered to a third solder bump, where the third conductive pillar has a cylindrical shape with a uniform first width, and the third solder bump has a cylindrical shape with a uniform second width. In an embodiment, the first width is equal to the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
    a first die;
    a first substrate bonded to the first die using a plurality of first conductive connectors, wherein each of the plurality of first conductive connectors comprises a first conductive pillar adhered to a first solder bump, wherein each of the plurality of first conductive connectors comprises an hourglass shape, wherein a lower portion of the first solder bump extends through a solder resist layer, and wherein the first solder bump decreases continuously in width in a direction toward a mid-point between a bottommost surface of the first conductive pillar and a topmost surface of the solder resist layer, wherein the first solder bump comprises a single homogeneous material, and wherein a middle portion of the first solder bump at the mid-point between the bottommost surface of the first conductive pillar and the topmost surface of the solder resist layer is free of vertical sidewalls; and
    a second substrate bonded to the first substrate using a plurality of second conductive connectors.

2. The package of claim 1, wherein each of the plurality of second conductive connectors comprises a second conductive pillar adhered to a second solder bump, and wherein each of the plurality of second conductive connectors comprises an hourglass shape.

3. The package of claim 1 wherein each of the plurality of second conductive connectors comprises a third conductive pillar adhered to a third solder bump, wherein the third conductive pillar has a cylindrical shape with a uniform first width, and the third solder bump has a cylindrical shape with a uniform second width.

4. The package of claim 3, wherein the first width is equal to the second width.

5. The package of claim 1, further comprising a first underfill disposed between the first die and the first substrate, wherein the first underfill surrounds each of the plurality of first conductive connectors.

6. The package of claim 5, further comprising a second underfill disposed between the first substrate and the second substrate, wherein the second underfill surrounds each of the plurality of second conductive connectors, and wherein a material of the first underfill is different from a material of the second underfill.

7. A package comprising:
    a first die bonded to a first side of a first substrate using a plurality of first conductive connectors, wherein each of the plurality of first conductive connectors comprises a first conductive pillar adhered to a first solder bump, wherein the first conductive pillar has a uniform first width, wherein the first solder bump comprises an hourglass shape, wherein a lower portion of the first solder bump extends through a solder resist layer, wherein an upper portion of the first solder bump is disposed between a bottommost surface of the first conductive pillar and a topmost surface of the solder resist layer, wherein each sidewall of the upper portion of the first solder bump is curved; and
    a package component bonded to a second side of the first substrate using a plurality of second conductive connectors, wherein each of the plurality of second conductive connectors comprises a second conductive pillar adhered to a second solder bump, wherein the second conductive pillar has a uniform second width, and wherein the second solder bump comprises an hourglass shape.

8. The package of claim 7, further comprising through-vias extending through the first substrate.

9. The package of claim 8, wherein the through-vias electrically connect the plurality of first conductive connectors to the plurality of second conductive connectors.

10. The package of claim 7, further comprising a redistribution structure over the first substrate, wherein the solder resist layer is disposed over the redistribution structure.

11. The package of claim 10, wherein the first solder bump comprises a single homogeneous material.

12. The package of claim 11, wherein the lower portion of the first solder bump has a uniform third width, and wherein the third width is equal to the first width.

13. The package of claim 12, wherein the upper portion of the first solder bump decreases continuously in width in a direction toward a mid-point between the bottommost surface of the first conductive pillar and the topmost surface of the solder resist layer.

14. The package of claim 7, wherein the second solder bump comprises first sidewalls that are curved differently from each other.

15. The package of claim 14, wherein the second solder bump comprises second sidewalls that are sloping.

16. A package comprising:
    a first die bonded to a first side of a first substrate using a plurality of first conductive connectors, wherein each of the plurality of first conductive connectors comprises a first conductive pillar adhered to a first solder bump, wherein the first conductive pillar has sloping sidewalls, and wherein the first solder bump comprises:
        a first portion of the first solder bump extending through a first solder resist layer that is disposed on the first substrate, wherein the first portion of the first solder bump has sloping sidewalls; and a second portion of the first solder bump having a hourglass shape;

a package component bonded to a second side of the first substrate using a plurality of second conductive connectors, wherein each of the plurality of second conductive connectors comprises a second conductive pillar adhered to a second solder bump, wherein the second conductive pillar has a uniform first width; and through-vias extending through the first substrate to electrically connect the plurality of first conductive connectors to the plurality of second conductive connectors.

17. The package of claim 16, wherein the second solder bump comprises:

a first portion of the second solder bump extending through a second solder resist layer that is disposed on the package component; and a second portion of the second solder bump having a hourglass shape.

18. The package of claim 17, wherein the first portion of the second solder bump has a uniform second width.

19. The package of claim 17, wherein the first portion of the second solder bump has sloping sidewalls.

20. The package of claim 17, further comprising an underfill disposed between the first die and the first substrate, wherein the underfill surrounds each of the plurality of first conductive connectors.

* * * * *